(12) United States Patent
Kurokawa

(10) Patent No.: US 9,391,620 B2
(45) Date of Patent: Jul. 12, 2016

(54) PROGRAMMABLE LOGIC DEVICE AND SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 280 days.

(21) Appl. No.: 14/102,629

(22) Filed: Dec. 11, 2013

(65) Prior Publication Data

US 2014/0176185 A1    Jun. 26, 2014

(30) Foreign Application Priority Data

Dec. 24, 2012    (JP) .................................. 2012-280383

(51) Int. Cl.
*H03K 19/173*    (2006.01)

(52) U.S. Cl.
CPC .................................. *H03K 19/173* (2013.01)

(58) Field of Classification Search
None
See application file for complete search history.

(56) References Cited

U.S. PATENT DOCUMENTS

| | | | |
|---|---|---|---|
| 5,343,406 A | 8/1994 | Freeman | |
| 5,352,940 A | 10/1994 | Watson | |
| 5,432,719 A | 7/1995 | Freeman | |
| 5,488,316 A | 1/1996 | Freeman | |
| 5,731,856 A | 3/1998 | Kim et al. | |
| 5,744,864 A | 4/1998 | Cillessen et al. | |
| 5,808,942 A | 9/1998 | Sharpe-Geisler | |
| 6,057,704 A | 5/2000 | New et al. | |
| 6,172,521 B1 | 1/2001 | Motomura | |
| 6,184,709 B1 * | 2/2001 | New .................... | H03K 19/1776 326/38 |
| 6,278,290 B1 * | 8/2001 | Young .............. | H03K 19/17736 326/113 |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Thomas J Hiltunen
(74) *Attorney, Agent, or Firm* — Fish & Richardson P.C.

(57) ABSTRACT

A programmable logic device having a small layout area even with an increasing circuit scale. The programmable logic device includes first programmable logic elements (PLEs); a second PLE; first wirings to which a signal including configuration data is supplied in a first period and which are electrically connected to respective output terminals of the first PLEs in a second period; a second wiring electrically connected to an input terminal of the second PLE; and circuits each connected to the corresponding first wiring. Each of the circuits includes at least a first switch, a second switch, and a third switch. An on/off state of the second switch depends on a potential of a node to which the signal is supplied from the corresponding first wiring through the first switch. The second switch and the third switch control an electrical connection between the corresponding first wiring and the second wiring.

19 Claims, 17 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,933,747 B1* | 8/2005 | Bauer ............ G01R 31/318516 326/38 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,665 B1 | 8/2006 | Lewis et al. |
| 7,088,606 B2* | 8/2006 | Turner .................. G11C 5/005 365/149 |
| 7,105,868 B2 | 9/2006 | Nause et al. |
| 7,196,942 B2 | 3/2007 | Khurana et al. |
| 7,211,825 B2 | 5/2007 | Shih et al |
| 7,274,214 B1* | 9/2007 | Young .............. H03K 19/17796 326/101 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,400,167 B2* | 7/2008 | Lewis .............. H03K 19/17784 326/38 |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,248,101 B2 | 8/2012 | Voogel et al. |
| 8,952,722 B2* | 2/2015 | Ikeda ............... H03K 19/17772 326/38 |
| 8,970,251 B2* | 3/2015 | Kurokawa ............ H03K 19/094 326/38 |
| 9,007,093 B2 | 4/2015 | Kurokawa et al. |
| 9,065,438 B2* | 6/2015 | Aoki ............... H03K 19/018585 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0300201 A1 | 12/2007 | Matsumoto |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0243652 A1 | 10/2009 | Dorairaj et al. |
| 2009/0278122 A1 | 11/2009 | Hosono et al. |
| 2009/0280600 A1 | 11/2009 | Hosono et al. |
| 2010/0039138 A1 | 2/2010 | Bertin |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0175646 A1 | 7/2011 | Takemura |
| 2012/0212995 A1 | 8/2012 | Kurokawa |
| 2012/0293201 A1 | 11/2012 | Fujita et al. |
| 2013/0285697 A1* | 10/2013 | Kurokawa ........ H03K 19/17784 326/38 |
| 2013/0293263 A1 | 11/2013 | Kurokawa |
| 2013/0314124 A1 | 11/2013 | Ikeda et al. |
| 2013/0321025 A1* | 12/2013 | Kurokawa ............ H03K 19/177 326/41 |
| 2015/0008958 A1* | 1/2015 | Kurokawa ...... H03K 19/018521 326/41 |
| 2015/0171865 A1 | 6/2015 | Kurokawa |
| 2015/0222269 A1 | 8/2015 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285014 A | 10/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and

(56) References Cited

OTHER PUBLICATIONS

Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

FIG. 13A
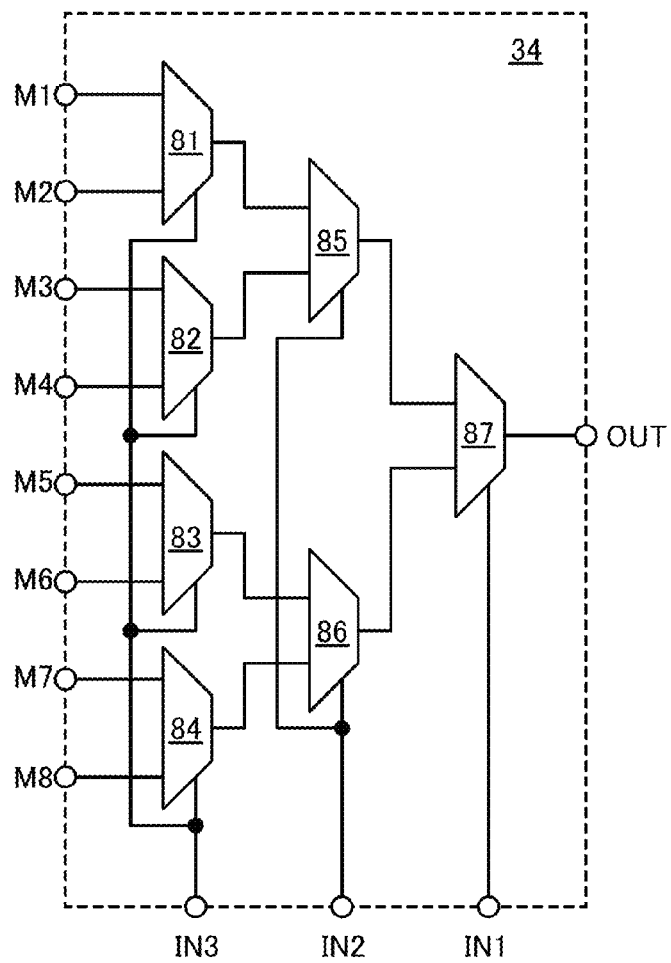
FIG. 13B
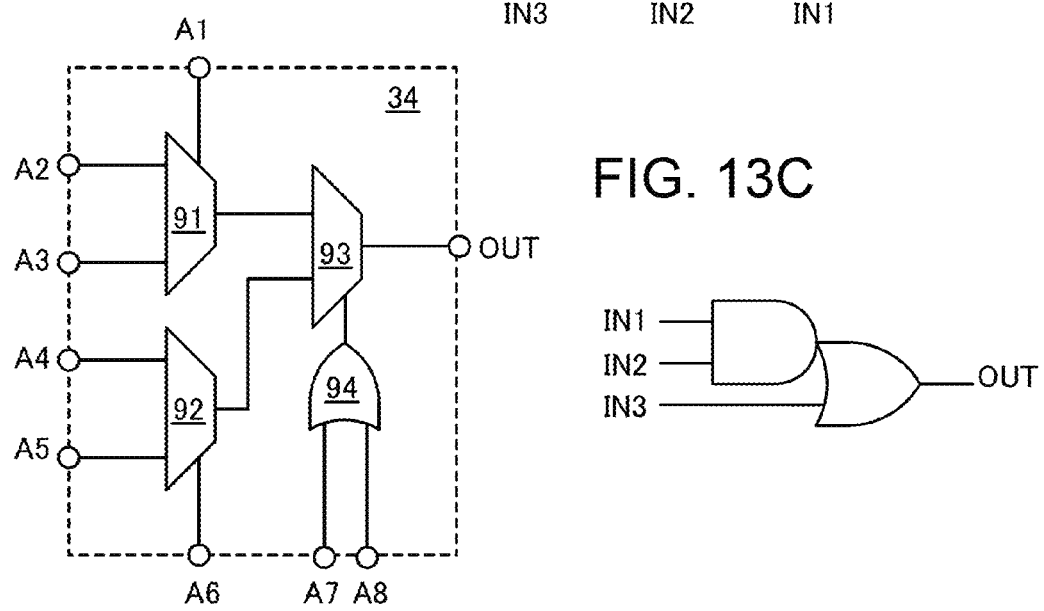
FIG. 13C

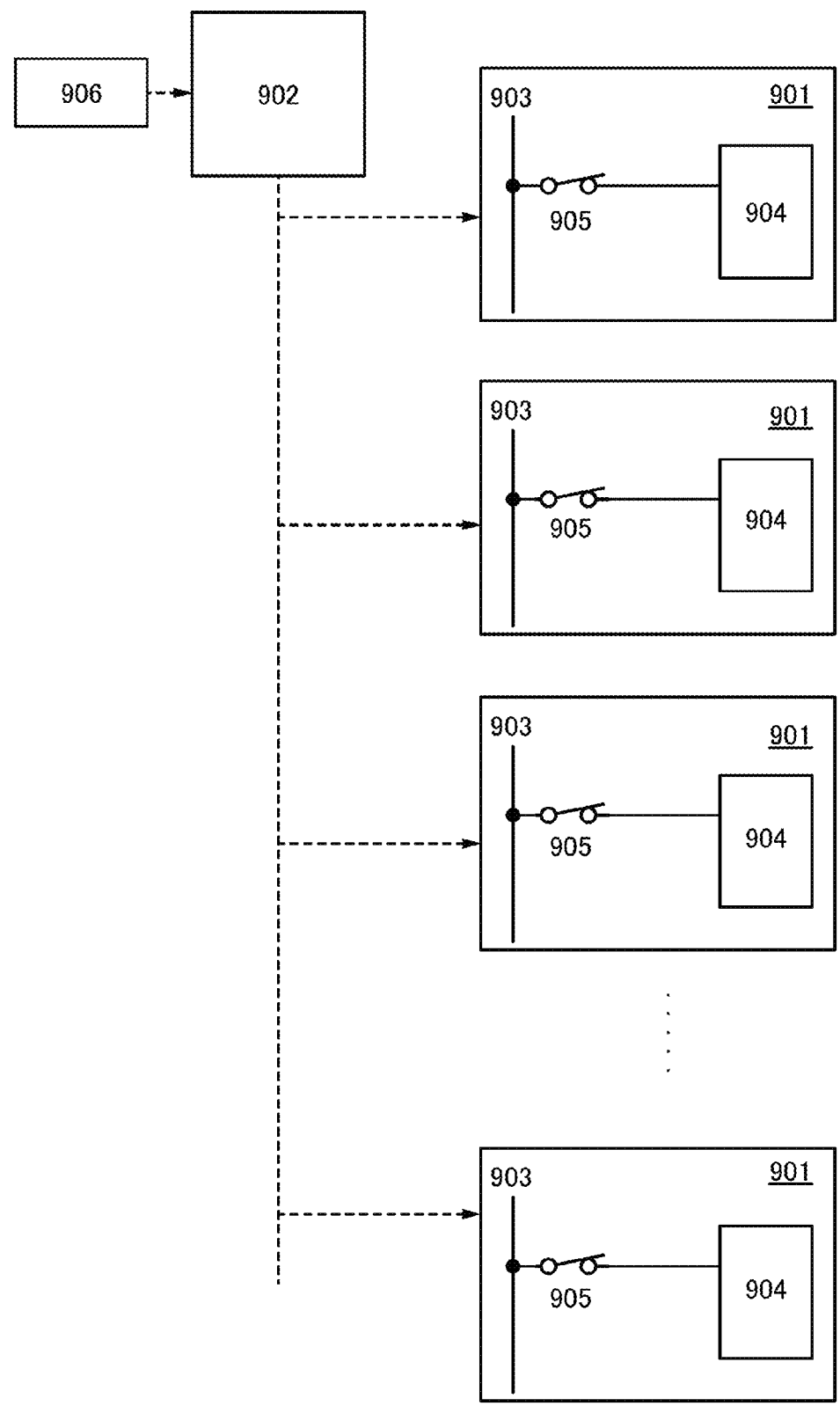

PROGRAMMABLE LOGIC DEVICE AND SEMICONDUCTOR DEVICE

BACKGROUND OF THE INVENTION

1. Field of the Invention

One embodiment of the present invention relates to a programmable logic device which can change the structure of hardware and a semiconductor device.

2. Description of the Related Art

In a programmable logic device (PLD), a logic circuit is composed of an adequate number of programmable logic elements (basic blocks), and the function of each programmable logic element and interconnections between the programmable logic elements can be changed after manufacture. Specifically, the PLD includes a plurality of programmable logic elements and a routing resource for controlling a connection between the programmable logic elements. The programmable logic element and the routing resource each include a register. The register stores circuit information (configuration data) for defining the function of each programmable logic element and a connection between the programmable logic elements formed by the routing resource.

A register for storing configuration data is called a configuration memory. Storing configuration data in a configuration memory is called configuration. In particular, rewriting the configuration memory with another configuration data is called reconfiguration.

Patent Document 1 discloses a programmable LSI which stores configuration data sent from a DRAM in a configuration memory composed of an SRAM to perform reconfiguration in a short time.

REFERENCE

Patent Document

[Patent Document 1] Japanese Published Patent Application No. 10-285014.

SUMMARY OF THE INVENTION

As the circuit scale of the programmable logic device increases, a configuration memory with larger storage capacity is needed, so that it is difficult to prevent the area of the programmable logic device from increasing.

In view of the above, an object of one embodiment of the present invention is to provide a programmable logic device having a small layout area even with an increasing circuit scale.

Another object of one embodiment of the present invention is to provide a semiconductor device or the like whose size can be reduced even when the circuit scale of a PLD is increased.

In one embodiment of the present invention, a switch circuit included in a routing resource is equipped with a function of a storage device that holds data on its on/off state. Specifically, the switch circuit includes a plurality of first wirings, a second wiring, and a plurality of circuits. A signal including configuration data is supplied to the plurality of the first wirings in a first period and the plurality of the first wirings are electrically connected to respective output terminals of a plurality of first programmable logic elements in a second period. The second wiring is electrically connected to an input terminal of a second programmable logic element. The plurality of the circuits are connected to the corresponding first wiring. Each of the plurality of the circuits includes at least a first switch, a second switch, and a third switch. An on/off state of the second switch depends on a potential of a node to which the signal including configuration data from the corresponding first wiring is supplied through the first switch. The second switch and the third switch control an electrical connection between the corresponding first wiring and the second wiring.

When the second switch in one of the plurality of the circuits is turned on in accordance with the configuration data and the third switches in all of the plurality of the circuits are turned on, an electrical connection between the second wiring and the plurality of the first wirings is determined.

In one embodiment of the present invention, with the above structure, an electrical connection between the second programmable logic element and the plurality of the first programmable logic elements can be controlled by one switch circuit. Further, since the electrical connection can be maintained when the first switches in the switch circuit are turned off, the switch circuit can serve as a storage device. Accordingly, one embodiment of the present invention can reduce the number of elements, such as transistors, included in the routing resource; thus, the circuit scale of the programmable logic device can be prevented from being increased and the area of the programmable logic device can be kept small.

One embodiment of the present invention can provide a programmable logic device having a small layout area even with an increasing circuit scale. One embodiment of the present invention can provide a semiconductor device that is reduced in size.

BRIEF DESCRIPTION OF THE DRAWINGS

FIGS. 13A to 13C each illustrate a structure of a LUT.
FIG. 17 illustrates a system.

DETAILED DESCRIPTION OF THE INVENTION

Embodiments of the present invention will be described below in detail with reference to the accompanying drawings. Note that the present invention is not limited to the following description, and it is easily understood by those skilled in the art that the mode and details can be variously changed without departing from the scope and spirit of the present invention. Accordingly, the present invention should not be construed as being limited to the description of the embodiments below.

Note that a programmable logic device of one embodiment of the present invention includes, in its category, a variety of semiconductor integrated circuits formed using semiconductor elements, such as microprocessors, image processing circuits, controllers for semiconductor display devices, digital signal processors (DSP), and microcontrollers. A semiconductor device of one embodiment of the present invention includes, in its category, various devices such as RF tags formed using any of the above semiconductor integrated circuits and semiconductor display devices. The semiconductor display device includes, in its category, liquid crystal display devices, light-emitting devices in which a light-emitting element typified by an organic light-emitting diode (OLED) is provided for each pixel, electronic paper, digital micromirror devices (DMD), plasma display panels (PDP), field emission displays (FED), and other semiconductor display devices in which a semiconductor element is included in a driver circuit.

<Structural Example of Switch Circuit>

First, a structural example of a switch circuit included in a semiconductor device of one embodiment of the present invention will be described.

Figure 1A:
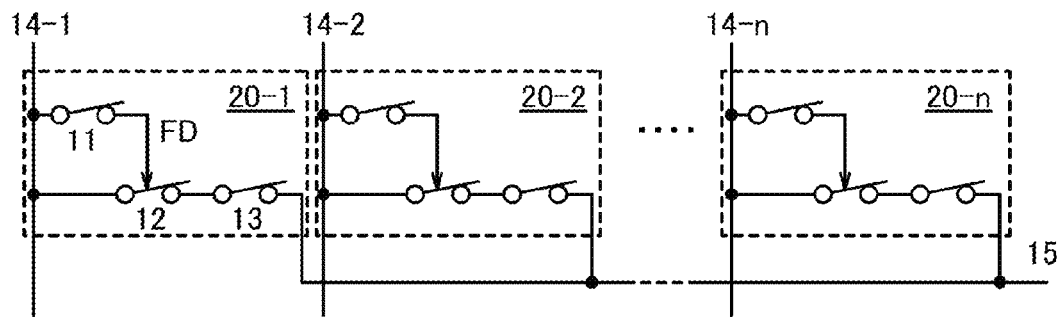
FIGS. 1A and 1B each illustrate a structural example of a switch circuit.

FIG. 1A illustrates a structural example of a switch circuit 10. The switch circuit 10 includes a plurality of wirings 14 which are represented as wirings 14-1 to 14-$n$ (n is a natural number of two or more) and a wiring 15. The switch circuit 10 also includes a plurality of circuits 20 each including at least a switch 11, a switch 12, and a switch 13. FIG. 1A illustrates, as an example, a case where the switch circuit 10 includes the plurality of the circuits 20 which are illustrated as circuits 20-1 to 20-$n$.

The plurality of the wirings 14 are each connected to the corresponding circuit 20. In FIG. 1A, for example, the wiring 14-$i$ (i is a natural number of n or less) is connected to a circuit 20-$i$.

Each of the wirings 14 is electrically connected to a node FD in the corresponding circuit 20 through the switch 11 included in the circuit 20. This means that the switch 11 has a function of controlling supply of the potential of the wiring 14 to the node FD. Further, the on/off state of the switch 12 depends on the potential of the node FD. The switch 13 is electrically connected in series to the switch 12 between the wiring 14 and the wiring 15.

Note that in this specification, the term "connection" means electrical connection and corresponds to a state in which a current, a voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

Different signals are supplied to the wirings 14 depending on periods. In a first period, the potential of a signal including configuration data is supplied to the wirings 14; accordingly, the configuration data is written to the switch circuit 10. Further, in a second period, the potential of signals output from programmable logic elements (PLEs) are supplied to the wirings 14; accordingly, an electrical connection between the wiring 15 and the plurality of the wirings 14 is determined.

Specifically, in the circuit illustrated in FIG. 1A, when the potential of the signal including the configuration data is supplied to the wiring 14 and the switch 11 is turned on in the first period, the potential is supplied to the node FD through the switch 11. Then, when the switch 11 is turned off, the potential supplied to the node FD is held. Thus, the on/off state of the switch 12 is selected in accordance with the potential of the node FD which reflects the configuration data.

Since the switch 13 is electrically connected in series to the switch 12, the switch 13 and the switch 12 collectively have a function of controlling an electrical connection between the wiring 15 and the wiring 14. Specifically, when the switch 12 and the switch 13 are on, the wiring 14 and the wiring 15 are electrically connected to each other. When at least one of the switch 12 and the switch 13 is off, the wiring 14 and the wiring 15 are electrically isolated from each other.

Further, in the circuit illustrated in FIG. 1A, when the potential of the signal output from the programmable logic element (PLE) is supplied to the wiring 14 and the switch 13 is turned on in the second period, it is determined whether the wiring 14 and the wiring 15 are electrically connected to each other or electrically isolated from each other is determined depending on the on/off state of the switch 12. In other words, the electrical connection between the wiring 15 and the plurality of the wirings 14 is determined in accordance with configuration data written to each of the circuits 20 in the switch circuit 10.

Note that the wiring 15 is electrically connected to input terminals of one PLE and one I/O element (IO). The IO has a function of an interface that controls input of a signal to the PLE from the outside of a programmable logic device (PLD) or output of a signal from the PLE to the outside of the PLD. The electrical connection between the wiring 15 and the plurality of the wirings 14 is determined in accordance with the configuration data; this means that an electrical connection between an input terminal of the one PLE or the one IO and output terminals of the PLEs or IOs is determined.

Note that an input terminal in this specification refers to a node of a wiring or the like supplied with an input signal, and the potential, voltage, current, or the like of an input signal is supplied to a circuit through the node. Thus, a wiring electrically connected to the input terminal can be regarded as part of the input terminal. Moreover, an output terminal in this specification refers to a node of a wiring or the like supplied with an output signal, and the potential, voltage, current, or the like of an output signal is output to a circuit through the node. Thus, a wiring electrically connected to the output terminal can be regarded as part of the output terminal.

In one embodiment of the present invention, the electrical connection between the one PLE or the one IO and a plurality of the PLEs or a plurality of the IOs can be controlled by one switch circuit 10. When the switches 11 in the switch circuit 10 are turned off, the electrical connection can be maintained, which means that the switch circuit 10 can serve as a configuration memory. Accordingly, when the switch circuit 10 is used for the routing resource, the number of elements, such as transistors, included in the routing resource can be reduced; thus, the circuit scale of the PLD can be prevented from being increased and the area of the PLD can be kept small.

Next, another structural example of the switch circuit included in the semiconductor device of one embodiment of the present invention will be described.

Figure 1B:
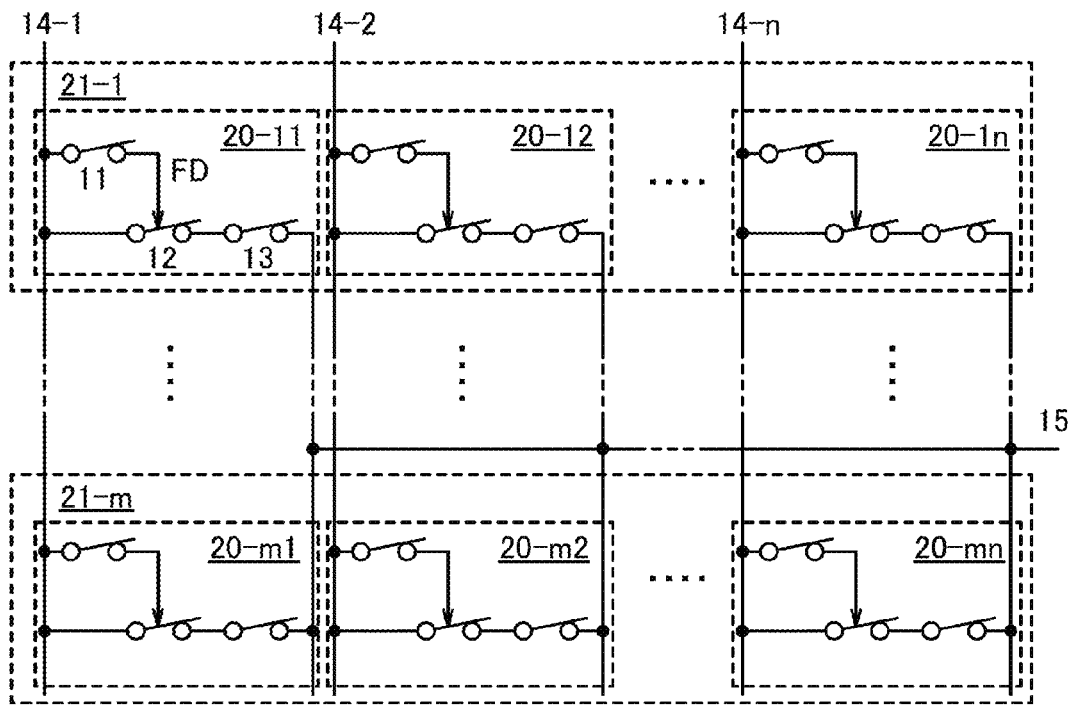

FIG. 1B illustrates a structural example of the switch circuit 10. FIG. 1B illustrates an example of the switch circuit 10 which can achieve dynamic reconfiguration utilizing a multi-context system.

The structure of the switch circuit 10 illustrated in FIG. 1B is the same as that of the switch circuit 10 illustrated in FIG. 1A in that the plurality of the wirings 14-1 to 14-$n$ (n is a natural number of two or more), the wiring 15, and the plurality of the circuits 20 each including at least the switch 11, the switch 12, and the switch 13 are included. However, the structure of the switch circuit 10 illustrated in FIG. 1B is different from that of the switch circuit 10 illustrated in FIG. 1A in that two or more circuits 20 are connected to one given wiring 14.

Specifically, the switch circuit 10 illustrated in FIG. 1B includes m×n circuits 20 (m is a natural number of two or more). Further, one of the wirings 14 is connected to m circuits 20. Furthermore, the m×n circuits 20 include m sets 21 of n circuits 20 connected to different wirings 14. In FIG. 1B, the m sets 21 represented as sets 21-1 to 21-m are included in the switch circuit 10. In the m×n circuits 20, the operations of the switches 13 are controlled in each of the sets 21.

In FIG. 1B, the circuit 20 which is connected to the wiring 14-i and included in the set 21-j (j is a natural number of m or less) is described as a circuit 20-ji.

In the switch circuit 10 illustrated in FIG. 1B, configuration data is written to the circuits 20 in each of the sets 21. Specifically, in each of a plurality of the circuits 20 included in one of the sets 21, the switch 11 is turned on and the potential of the signal including the configuration data is supplied to the node FD through the switch 11. Then, in each of the plurality of the circuits 20 included in the one set 21, the switch 11 is turned off so that the potential of the node FD is held. After that, the above operation is repeated in a plurality of the circuits 20 included in another set 21 one by one, so that configuration data can be written to all of the circuits 20.

Further, in the switch circuit 10 illustrated in FIG. 1B, one of the plurality of the sets 21 is selected, and an electrical connection between the wiring 15 and the plurality of the wirings 14 can be determined in accordance with configuration data held in a plurality of the circuits 20 included in the selected set 21. To change the electrical connection between the wiring 15 and the plurality of the wirings 14, another set 21 is selected in the switch circuit 10 and the electrical connection between the wiring 15 and the plurality of the wirings 14 can be determined in accordance with configuration data held in a plurality of the circuits 20 included in the selected set 21.

As in the switch circuit 10 illustrated in FIG. 1A, the switch circuit 10 illustrated in FIG. 1B has a function of controlling an electrical connection between one PLE or one IO and a plurality of PLEs or a plurality of IOs, and a function of a configuration memory which maintains the electrical connection. Accordingly, when the switch circuit 10 illustrated in FIG. 1B is used as the routing resource, the number of elements, such as transistors, included in the routing resource can be reduced; thus, the circuit scale of the PLD can be prevented from being increased and the area of the PLD can be kept small.

In addition, in the switch circuit 10 illustrated in FIG. 1B, a plurality of pieces of configuration data are held in the respective sets 21 and configuration data can be selected freely by the selection of the set 21. Accordingly, one piece of configuration data can be rewritten while a PLD whose circuit structure is configured in accordance with another piece of configuration data operates.

In Patent Document 1 mentioned above, configuration data needs to be read from a DRAM to switch configuration data in a multi-context system, and a sense amplifier is required to read the configuration data. In the PLD of one embodiment of the present invention, which includes the switch circuit 10 illustrated in FIG. 1B, configuration data is not needed to be read from a DRAM or the like using a sense amplifier every time the circuit structure is switched. Consequently, a time for switching the circuit structure can be shortened, and as a result, a logic circuit in a programmable logic device can be reconfigured at high speed.

In each of the switch circuits 10 illustrated in FIGS. 1A and 1B, the wirings 14 have a function of supplying the potential of the signal including configuration data to the circuits 20 and a function of supplying the potential of a signal output from the PLEs to the circuits 20. Thus, the number of wirings provided in the switch circuit 10 can be small as compared with the case where a wiring having a function of supplying the potential of the signal including configuration data to the circuits 20 and a wiring having a function of supplying the potential of the signal output from the PLEs to the circuits 20 are connected to the circuits 20. As a result, with the use of the switch circuit 10 illustrated in FIG. 1A or FIG. 1B, the routing resource can be small and a programmable logic device having a small layout area can be fabricated even when the circuit scale is increased. Further, the small routing resource enables a small semiconductor device to be fabricated.

<Specific Structural Example of Switch Circuit>

Next, a specific structural example of the switch circuit 10 illustrated in FIG. 1A is described. The switch circuit 10 illustrated in FIG. 2 includes the wirings 14-1 to 14-n, the wiring 15, a wiring 17, and a wiring 18. The switch circuit 10 illustrated in FIG. 2 also includes the circuits 20-1 to 20-n. Each of the circuits 20 includes at least a transistor 11t serving as the switch 11, a transistor 12t serving as the switch 12, a transistor 13t serving as the switch 13, and a capacitor 16.

Specifically, in the circuit 20-i, a gate of the transistor 11t is electrically connected to the wiring 17. One of a source and a drain of the transistor 11t is electrically connected to the wiring 14-i, and the other thereof is electrically connected to a gate of the transistor 12t. One of a source and a drain of the transistor 12t is electrically connected to the wiring 14-i, and the other thereof is electrically connected to one of a source and a drain of the transistor 13t. The other of the source and the drain of the transistor 13t is electrically connected to the wiring 15. A gate of the transistor 13t is electrically connected to the wiring 18.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Each of the circuits 20 may also include another circuit element such as a transistor, a diode, a resistor, a capacitor, an inductor, or the like as necessary.

Figure 2:
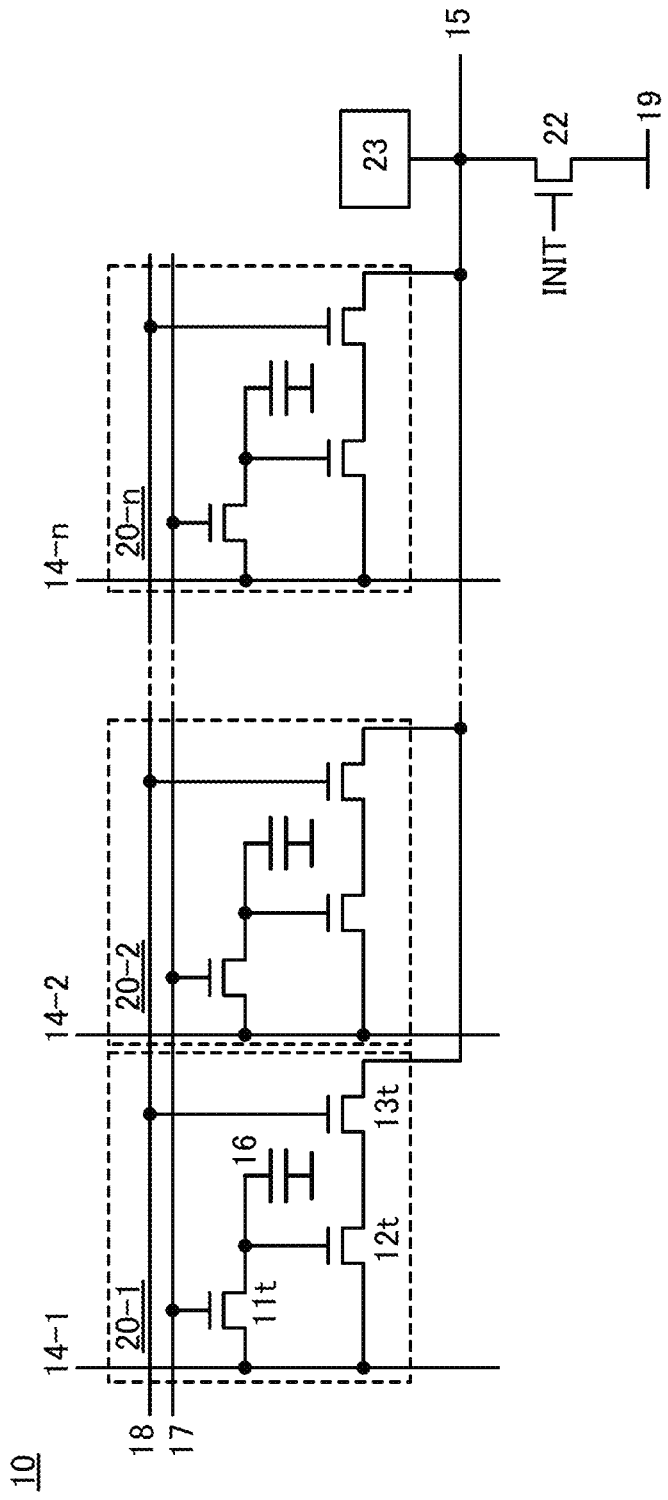
FIG. 2 illustrates a structural example of a switch circuit.

The switch circuit 10 illustrated in FIG. 2 includes a switch 22 for controlling an electrical connection between the wiring 15 and a wiring 19 to which a predetermined potential is applied. In FIG. 2, one transistor is used as the switch 22. The on/off state of the switch 22 is selected (switched) in accordance with a signal NIT. Specifically, the potential of the wiring 19 is applied to the wiring 15 when the switch 22 is on, whereas the potential of the wiring 19 is not applied to the wiring 15 when the switch 22 is off.

By turning on the switch 22, the potential of the wiring 15 can be initialized to be at a predetermined level. Note that the potentials of the wiring 15 and the wirings 14 are likely to become floating after the PLD is powered off. After the PLD is powered off, configuration data is sometimes lost depending on the structure of a storage element included in a configuration memory. In this case, when the PLD is powered on, electrical continuity is established between the wiring 15 and the plurality of the wirings 14 through the switch circuit 10, and a large amount of current sometimes flows in these wirings when the wiring 15 and the plurality of the wirings 14 have different potentials. However, the potential of the wiring 15 is initialized as described above, thereby preventing a large amount of current from flowing between the wiring 15 and the plurality of the wirings 14. This can prevent breakage of the PLD.

The potential of the input terminal of the PLE sometimes becomes an intermediate potential between high-level potential and low-level potential immediately after the PLD is powered on. If the intermediate potential is applied to the input terminal of the PLE, a shoot-through current is likely to be generated in a CMOS circuit included in the PLE. However, since the potential of the wiring 15 can be initialized as described above, the input terminal can be prevented from having the intermediate potential immediately after power is turned on; thus, generation of the shoot-through current can be prevented.

A latch may be electrically connected to the wiring 15. In FIG. 2, in addition to the switch 22 for performing initialization, a latch 23 is electrically connected to the wiring 15. The latch 23 has a function of keeping the potential of the wiring 15, which is electrically connected to the input terminal of the PLE, high or low. When the latch 23 is electrically connected to the wiring 15, the potential of the wiring 15 can be kept high or low after the PLD is powered on. Accordingly, application of an intermediate potential to the wiring 15 can prevent a shoot-through current from being generated in the PLE having the input terminal connected to the wiring 15.

Next, a specific structural example of the switch circuit 10 illustrated in FIG. 1B is described. The switch circuit 10 illustrated in FIG. 3 includes the wirings 14-1 to 14-$n$, the wiring 15, a plurality of the wirings 17 represented as wirings 17-1 to 17-$m$, and a plurality of the wirings 18 represented as wirings 18-1 to 18-$m$. The switch circuit 10 illustrated in FIG. 3 also includes the m×n circuits 20. Each of the circuits 20 includes at least the transistor 11$t$ serving as the switch 11, the transistor 12$t$ serving as the switch 12, the transistor 13$t$ serving as the switch 13, and the capacitor 16.

Figure 3:
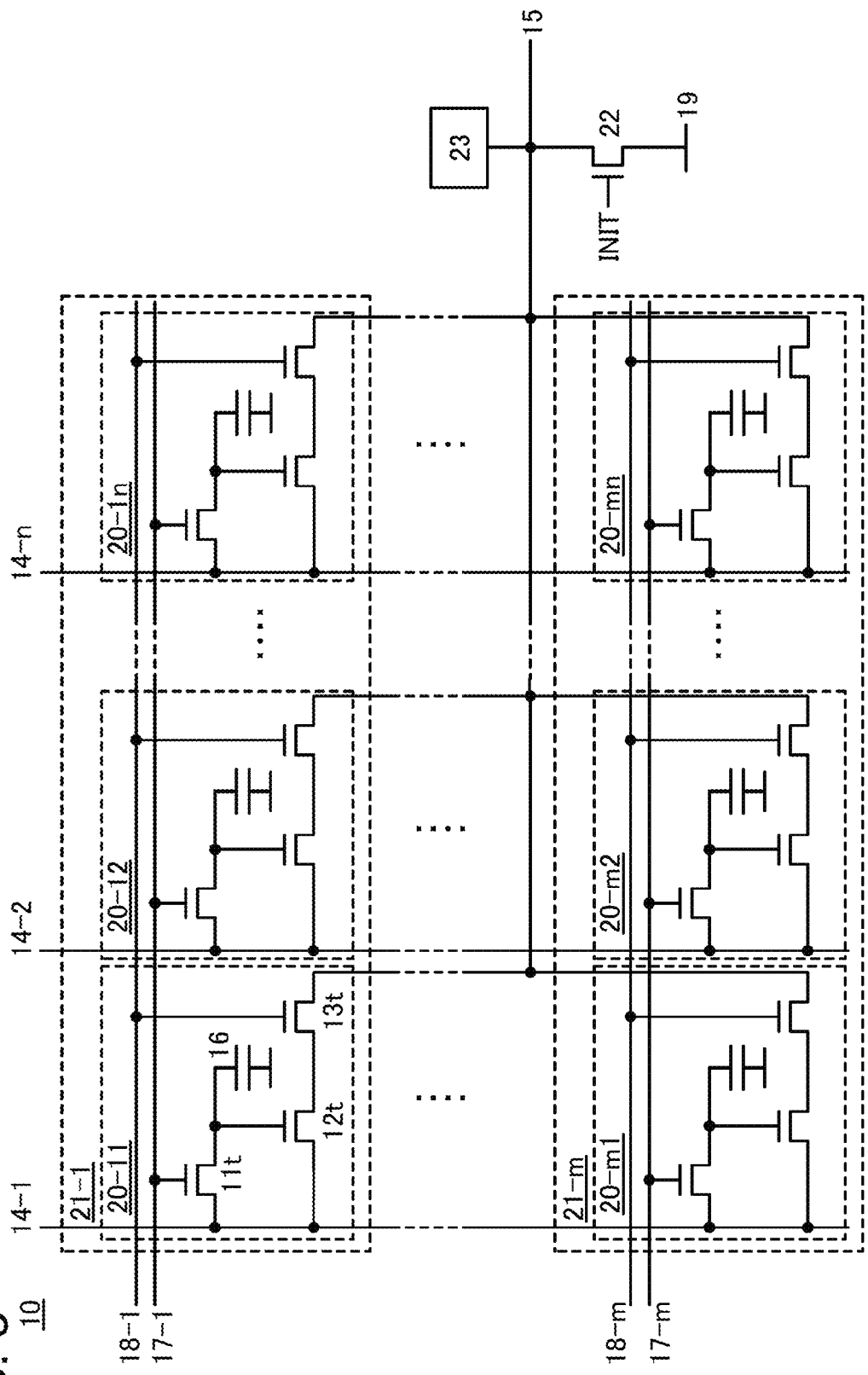
FIG. 3 illustrates a structural example of a switch circuit.

In the m×n circuits 20, there are m sets 21 including n circuits 20, each of which is connected to the corresponding wirings 17-$j$ and 18-$j$. In FIG. 3, m sets 21 are illustrated as the sets 21-1 to 21-$m$.

Specifically, the gate of the transistor 11$t$ in the circuit 20-$ji$ is electrically connected to the wiring 17-$j$. One of the source and the drain of the transistor 11$t$ is electrically connected to the wiring 14-$i$, and the other thereof is electrically connected to the gate of the transistor 12$t$. One of the source and the drain of the transistor 12$t$ is electrically connected to the wiring 14-$i$, and the other thereof is electrically connected to one of the source and the drain of the transistor 13$t$. The other of the source and the drain of the transistor 13$t$ is electrically connected to the wiring 15. The gate of the transistor 13$t$ is electrically connected to the wiring 18-$j$.

Each of the circuits 20 may also include another circuit element such as a transistor, a diode, a resistor, a capacitor, an inductor, or the like as necessary.

As in the switch circuit 10 illustrated in FIG. 2, the switch circuit 10 illustrated in FIG. 3 includes the switch 22 for controlling an electrical connection between the wiring 15 and the wiring 19 to which a predetermined potential is applied. Further, the latch 23 is electrically connected to the wiring 15 in FIG. 3. The latch 23 has a function of keeping the potential of the wiring 15, which is electrically connected to the input terminal of the PLE, high or low.

Note that the transistor 11$t$ is preferably a transistor with extremely small off-state current because it has a function of holding the potential of the node FD in the switch circuit 10 illustrated in FIG. 2 or FIG. 3. A transistor in which a channel formation region is formed in a film of a semiconductor having a wider band gap and lower intrinsic carrier density than silicon has extremely small off-state current and thus is preferably used as the transistor 11$t$. Examples of such a semiconductor are an oxide semiconductor and gallium nitride that have a band gap more than twice as wide as that of silicon. A transistor including the semiconductor can have much smaller off-state current than a transistor including a normal semiconductor such as silicon or germanium. Consequently, the use of the transistor 11$t$ having the above structure can prevent leakage of electric charge held at the node FD.

In the switch circuits 10 illustrated in FIG. 2 and FIG. 3, when the switch 11 of each of the circuits 20 is off, the node FD becomes floating with excellent insulating property between the node FD and other electrodes or wirings, so that a boosting effect described below can be expected. Specifically, when the node FD is floating in the circuit 20, the potential of the node FD is increased by a capacitance Cgs generated between the source and the gate of the transistor serving as the switch 12, as the potential of the wiring 14 changes from low a level to a high level. The increase in the potential of the node FD depends on the logic level of configuration data input to the gate of the transistor. Specifically, when configuration data input to the circuit 20 is "0", the transistor is in a weak inversion mode, so that the capacitance Cgs that contributes to an increase in the potential of the node FD includes a capacitance Cos that is independent of the potential of the gate electrode, that is, the potential of the node FD. The capacitance Cos specifically includes overlap capacitance generated in a region where the gate electrode and a source region overlap with each other, and parasitic capacitance generated between the gate electrode and the source electrode. On the other hand, when configuration data written into the circuit 20 is "1", the transistor is in a strong inversion mode, so that the capacitance Cgs that contributes to an increase in the potential of the node FD includes, in addition to the capacitance Cos, part of a capacitance Cox generated between a channel formation region and the gate electrode. Thus, the capacitance Cgs that contributes to an increase in the potential of the node FD is larger with the configuration data "1" than with the configuration data "0". Consequently, the circuit 20 storing configuration data "1" can have a larger boosting effect than the circuit 20 storing configuration data "0"; by the boosting effect, the potential of the node FD is increased with a change in the potential of the wiring 14. Thus, in the case where the configuration data is "1", even when the potential of the node FD is dropped from the potential of the signal including the configuration data input to the wirings 14 by the threshold voltage of the transistor included in the switch 11, the potential of the node FD can be boosted because of the boosting effect. As a result, the transistor serving as the switch 12 can be reliably turned on and the switching speed of the circuit 20 can be increased. Further, the transistor serving as the switch 12 can be kept off when the configuration data is "0".

<Structural Example of Driver Circuit>

Figure 4:
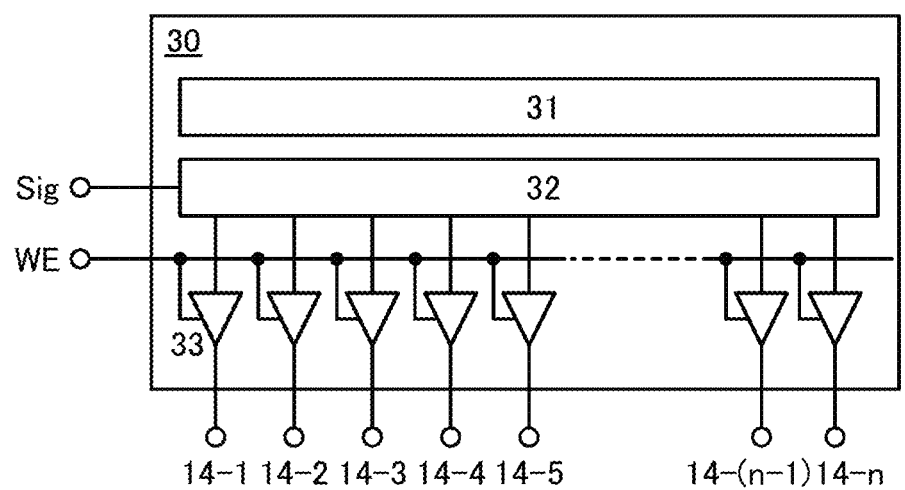
FIG. 4 illustrates a structural example of a driver circuit.

Next, a structural example of a driver circuit 30 for controlling supply of the signal including configuration data to the wirings 14 is illustrated in FIG. 4. The driver circuit 30 illustrated in FIG. 4 includes a circuit 31, such as a shift register, which controls timing of sampling of a signal Sig including configuration data, a circuit 32 which performs sampling of the signal Sig at the timing determined by the circuit 31, and a plurality of switches 33 which control supply of the sampled signal to the wirings 14-1 to 14-n. FIG. 4 illustrates an example where a three-state buffer, the impedance of which is set high in accordance with a signal WE, is used as the switch 33.

Specifically, in FIG. 4, when the potential of the signal WE is at a high level, the switches 33 supply signals with the same logical values as signals input to input terminals to the wirings 14-1 to 14-n. On the other hand, when the potential of the signal WE is at a low level, the switches 33 have high impedance and the signals input to the input terminals are not supplied to the wirings 14-1 to 14-n.

<Structural Example 1 of PLE>

Figure 5:
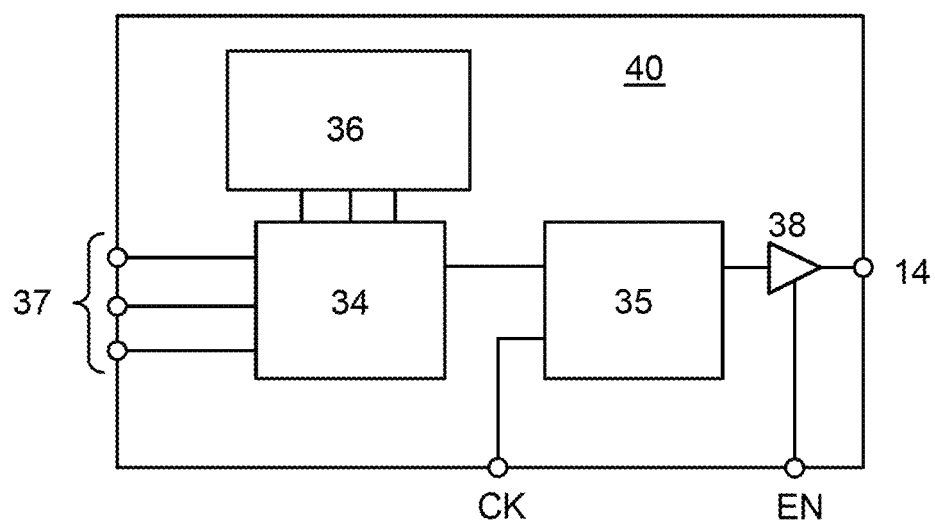
FIG. 5 illustrates a structural example of a programmable logic element.

FIG. 5 illustrates an example of a PLE 40. The PLE 40 illustrated in FIG. 5 includes a lookup table (LUT) 34, a flip-flop 35, and a configuration memory 36. The configuration memory 36 has a function of storing configuration data transmitted from a memory element. Logic operation determined by the LUT 34 varies depending on configuration data stored in the configuration memory 36. When logic operation to be performed by the LUT 34 is determined in accordance with the configuration data, the LUT 34 outputs an output signal corresponding to input signals input to input terminals 37. The flip-flop 35 holds the signal output from the LUT 34 and outputs an output signal corresponding to the signal in synchronization with a clock signal CK.

A switch 38 has a function of controlling supply of the signal, which is output from the flip-flop 35, to the wiring 14. FIG. 5 illustrates an example where a three-state buffer, the impedance of which is set high in accordance with a signal EN, is used as the switch 38.

Specifically, in FIG. 5 when the potential of the signal EN is at a high level, the switch 38 supplies a signal with the same logical value as a signal input to an input terminal to the wiring 14. On the other hand, when the potential of the signal EN is at a low level, the switch 38 has high impedance and the signal input to the input terminal is not supplied to the wiring 14.

Note that the PLE 40 may also include a multiplexer to select whether the output signal from the LUT 34 passes through the flip-flop 35 or not.

The type of the flip-flop 35 may be determined by configuration data. Specifically, the flip-flop 35 may have a function of any of a D flip-flop, a T flip-flop, a JK flip-flop, and an RS flip-flop depending on the configuration data.

<Operation Example of Switch Circuit>

Figure 6:
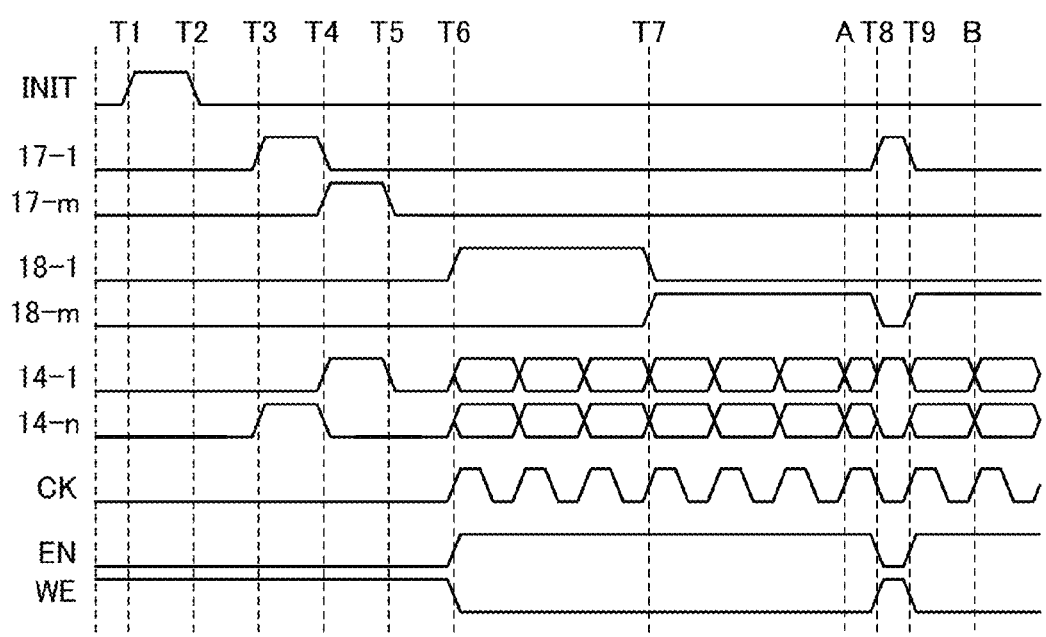
FIG. 6 is a timing chart.

Next, an example of the operation of the switch circuit 10 illustrated in FIG. 3 will be described with reference to a timing chart in FIG. 6. The timing chart in FIG. 6 shows the signal WE for controlling the operation of the switch 33 in the driver circuit 30 illustrated in FIG. 4, and the clock signal CK for controlling output of the output signal from the flip-flop 35 and the signal EN for controlling the operation of the switch 38 in the PLE 40 illustrated in FIG. 5. The timing chart in FIG. 6 shows an example where the transistors 11t to 13t are n-channel transistors. Note that a low-level potential VSS is applied to the wiring 19.

First, the description is made on initialization of the potential of the wiring 15 that is performed from time T1 to time T2 after the PLD is powered on.

From the time T1 to the time T2, the signal NIT with high-level potential is input to a gate of the transistor used as the switch 22, so that the switch 22 is turned on. Accordingly, the potential VSS of the wiring 19 is supplied to the wiring 15 through the switch 22.

Application of the potential VSS to the wiring 15 enables the potential of the wiring 15 to be initialized even when the potential of the wiring 15 is floating immediately after power is supplied to the PLD. Accordingly, the potential of the input terminal of the PLE electrically connected to the wiring 15 is not floating and shoot-through current can be prevented in the CMOS circuit included in the PLE. This can prevent breakage of the PLD. Note that when the PLD is powered on and the potential of the signal NIT is set high at the same time, a period during which the potential of the wiring 15 is floating can be shortened.

Further, from the time T1 to the time T2, low-level potential is applied to the wirings 18-1 to 18-m. Accordingly, the wiring 15 can be electrically isolated from the plurality of the wirings 14. In addition, from the time T1 to the time T2, the potential of the signal EN is low, the potential of the signal WE is high, and low-level potential, specifically the potential VSS which is the same potential as the wiring 19, is applied from the driver circuit 30 to the wirings 14-1 to 14-n. Accordingly, the level of the potential of the wiring 15 can be substantially the same as those of the plurality of the wirings 14. Thus, a large amount of current can be prevented from flowing in the wiring 15 and a plurality of the wirings 14 after power is supplied to the PLD. This can prevent breakage of the PLD.

After the initialization of the potential of the wiring 15, from time T3, the potential of the signal NIT is maintained at a low level and the switch 22 is turned off.

Next, writing of configuration data from the time T3 to time T5 is described. The potential of the signal EN is low in the above period; thus, supply of a signal from the PLE 40 to the wiring 14 is stopped. Further, the potential of the signal WE becomes high in the above period; thus, a signal including configuration data is supplied from the driver circuit 30 to the wiring 14. In addition, low-level potential is applied to all of the wirings 18.

From the time T3 to the time T4, high-level potential is applied to the wiring 17-1 and low-level potential is applied to all the wirings 17 including the wiring 17-m except the wiring 17-1. Further, low-level potential is applied to the wiring 14-1 and high-level potential is applied to the wiring 14-n. Accordingly, configuration data is written to the circuit 20-11 and the circuit 20-1n which are connected to the wiring 17-1 and a corresponding one of the wiring 14-1 and the wiring 14-n. Specifically, low-level potential is applied to the node FD in the circuit 20-11, so that configuration data corresponding to a logical value "0" is held. Meanwhile, high-level potential is applied to the node FD in the circuit 20-1n, so that configuration data corresponding to a logical value "1" is held.

Next, from the time T4 to the time T5, low-level potential is applied to all the wirings 17 including the wiring 17-1 except the wiring 17-m, and high-level potential is applied to the wiring 17-m. Further, high-level potential is applied to the wiring 14-1 and low-level potential is applied to the wiring 14-n. Accordingly, configuration data is written to the circuit 20-m1 and the circuit 20-mn which are connected to the wiring 17-m and a corresponding one of the wiring 14-1 and the wiring 14-n. Specifically, high-level potential is applied to the node FD in the circuit 20-m1, so that configuration data corresponding to a logical value "1" is held. Meanwhile, low-level potential is applied to the node FD in the circuit 20-mn, so that configuration data corresponding to a logical value "0" is held.

Although the timing chart illustrated in FIG. 6 shows only writing of configuration data to the circuit 20-11, the circuit 20-1n, the circuit 20-m1, and the circuit 20-mn, configuration data can be written to the other circuits 20 in a similar manner. Note that configuration data is held in only one of the plurality of the sets 21.

Next, switching of the circuit structure from time T6 to time T8 is described. The potential of the signal EN becomes high in the above period; thus, a signal is supplied from the PLE 40 to the wiring 14. Further, the potential of the signal WE becomes low in the above period; thus, supply of a signal including configuration data from the driver circuit 30 to the wiring 14 is stopped.

First, low-level potential is applied to all the wirings 17 from the time T6 to the time T7. Further, high-level potential is applied to the wiring 18-1 and low-level potential is applied to all the wirings 18 including the wiring 18-m except the wiring 18-1. Accordingly, an electrical connection between the wiring 15 and the wirings 14-1 to 14-n is determined by the circuits 20-11 to 20-1n connected to the wiring 18-1. Specifically, among the circuits 20-11 to 20-1n, configuration data corresponding to a logical value "1" is held in the circuit 20-1n; thus, the wiring 14-n and the wiring 15 are electrically connected to each other through the circuit 20-1n.

Then, low-level potential is applied to all the wirings 17 from the time T7 to the time T8. Further, low-level potential is applied to all the wirings 18 including the wiring 18-1 except the wiring 18-m and high-level potential is applied to the wiring 18-m. Accordingly, an electrical connection between the wiring 15 and the wirings 14-1 to 14-n is determined by the circuits 20-m1 to 20-mn connected to the wiring 18-m. Specifically, among the circuits 20-m1 to 20-mn, configuration data corresponding to a logical value "1" is held in the circuit 20-m1; thus, the wiring 14-1 and the wiring 15 are electrically connected to each other through the circuit 20-m1.

Next, rewriting of configuration data from the time T8 to time T9 is described. The potential of the signal EN becomes low in the above period; thus, supply of a signal from the PLE 40 to the wiring 14 is stopped. Further, the potential of the signal WE becomes high in the above period; thus, a signal including configuration data is supplied from the driver circuit 30 to the wiring 14. In addition, low-level potential is applied to all of the wirings 18.

Specifically, from the time T8 to the time T9, high-level potential is applied to the wiring 17-1 and low-level potential is applied to all the wirings 17 including the wiring 17-m except the wiring 17-1. Further, high-level potential is applied to the wiring 14-1 and low-level potential is applied to the wiring 14-n. Accordingly, configuration data is written to the circuit 20-11 and the circuit 20-1n which are connected to the wiring 17-1 and a corresponding one of the wiring 14-1 and the wiring 14-n. Specifically, high-level potential is applied to the node FD in the circuit 20-11, so that configuration data corresponding to a logical value "1" is held. Meanwhile, low-level potential is applied to the node FD in the circuit 20-1n, so that configuration data corresponding to a logical value "0" is held.

Note that low-level potential is applied to all the wirings 18 from the time T8 to the time T9, so that the logical value of a signal supplied to the wiring 15 just before the time T8 is held by the latch 23. Specifically, in the PLE 40 illustrated in FIG. 5, the latch 23 holds a signal which is output from the flip-flop 35 at time A at a rising edge of the clock signal CK occurs just before the time T8 and is input to the wiring 15 through the wiring 14-1 and the circuit 20-m1. It is preferable that the time T8 be set to ensure enough time to determine an output signal from the PLE 40 and holding the logical value of the output signal by the latch 23 after the rising edge of the clock signal CK.

Since the logical value of the signal input to the wiring 15 is held by the latch 23 as described above, rewriting of configuration data in the circuit 20-11 and the circuit 20-1n does not prevent the operation of PLD.

Note that when the time T9 is set to be before time B at which a rising edge occurs after two cycles of the clock signal CK from the time A, configuration data can be rewritten without an interruption of the operation of the PLD. Specifically, it is preferable that the time T9 be set so that enough set-up time can be ensured after the time T9 to input the output signal of the PLE 40 (the signal which is output from the flip-flop 35 of the PLE 40 in synchronization with the rising edge of the clock signal CK immediately after the time T8) to the wiring 15 through the wirings 14-1 to 14-n and the circuits 20-11 to 20-mn, and to hold the signal input from the wiring 15 to the one PLE in the flip-flop 35 at the time B.

Note that when the speed of writing configuration data to the switch circuit 10 is not high enough, the cycle of the clock signal CK from the time T8 to the time T9 is set larger than that of the clock signal CK in periods other than the period from the time T8 to the time T9. Accordingly, time for writing can be long, so that configuration data can be written between the time T8 and the time T9. Note that required writing time for a switch circuit included in the critical path of the PLD is different from that for other switch circuits. In such a case, the cycle of the clock signal CK may be changed in accordance with a required writing time.

Although FIG. 6 shows the case where the potential of the wiring 15 is initialized after power is supplied, the potentials of the nodes FD in the circuits 20 can be initialized in addition to the potential of the wiring 15. The potentials of the nodes FD may be sequentially initialized in every circuits 20, or the potentials of the nodes FD in all the circuits 20 may be initialized all at once.

<Structural Example of Latch>

Figure 7:
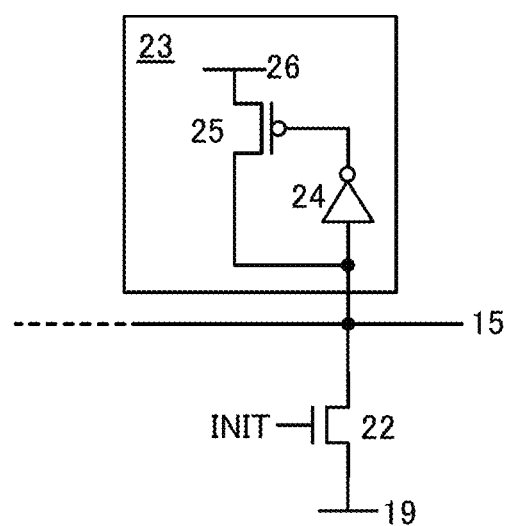
FIG. 7 illustrates a structural example of a latch.

FIG. 7 illustrates a structural example of the latch 23. The latch 23 illustrated in FIG. 7 includes an inverter 24 and a p-channel transistor 25. An input terminal of the inverter 24 is electrically connected to the wiring 15. An output terminal of the inverter 24 is electrically connected to a gate of the transistor 25. One of a source and a drain of the transistor 25 is electrically connected to a wiring 26 supplied with a potential higher than a potential applied to the wiring 19. The other of the source and the drain of the transistor 25 is electrically connected to the wiring 15.

In one embodiment of the present invention, the latch 23 having the above structure is electrically connected to the wiring 15, whereby the potential of the wiring 15 can be kept high or low after the PLD is powered on. Accordingly, application of an intermediate potential to the wiring 15 can prevent a shoot-through current from being generated in the PLE having the input terminal connected to the wiring 15.

<Structural Example 2 of PLE>

Figure 8A:
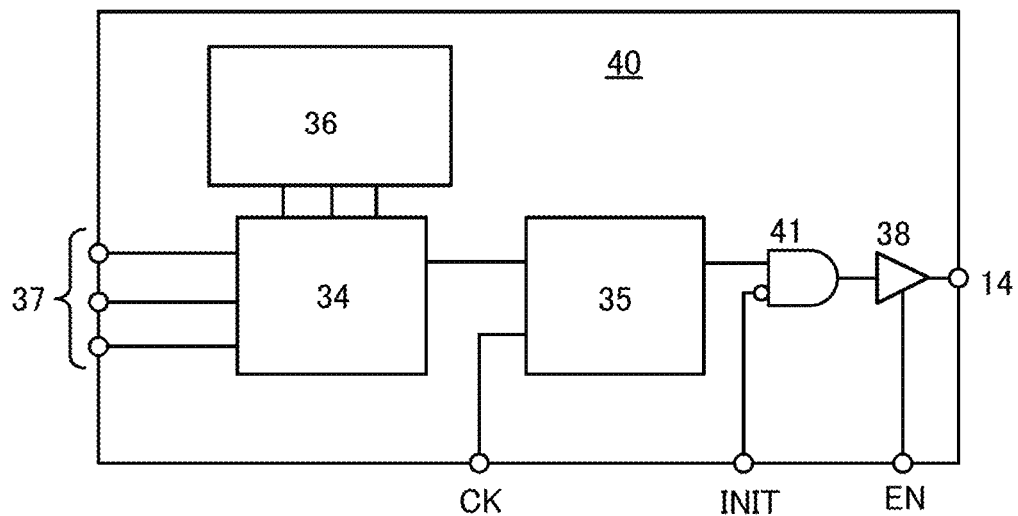
FIGS. 8A and 8B each illustrate a structural example of a programmable logic element.

FIG. 8A illustrates another example of the PLE 40. The PLE 40 illustrated in FIG. 8A includes an AND circuit 41 in addition to the components of the PLE 40 illustrated in FIG. 5. To the AND circuit 41, a signal from the flip-flop 35 is applied as an active high input, and the signal NIT for initializing the potential of the wiring 15 is applied as an active low input. Accordingly, an output signal from the PLE 40 can have the same potential as the wiring 19 illustrated in FIG. 7 when the potential of the wiring 15 illustrated in FIG. 7 is initialized in accordance with the signal NIT. As a result, a large amount of current can be prevented from flowing in the wiring 15 and the plurality of the wirings 14 to which the output signal from the PLE 40 is applied. Thus, breakage of the PLD can be prevented.

Figure 8B:
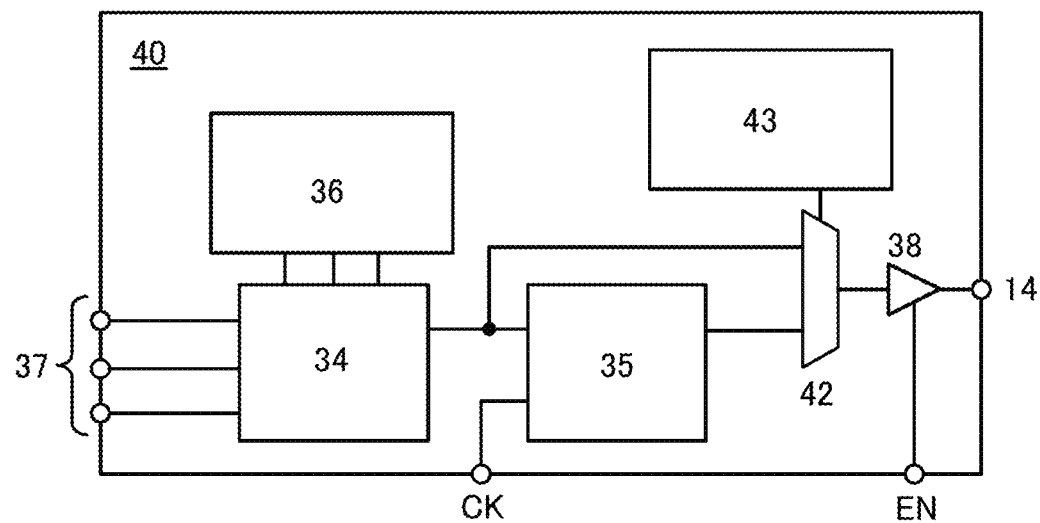

FIG. 8B illustrates another example of the PLE 40. The PLE 40 illustrated in FIG. 8B includes a multiplexer 42 and a configuration memory 43 in addition to the components of the PLE 40 in FIG. 5. In FIG. 8B, an output signal from the LUT 34 and an output signal from the flip-flop 35 are input to the multiplexer 42. The multiplexer 42 has a function of selecting and outputting one of the above two output signals in accordance with configuration data stored in the configuration memory 43. An output signal from the multiplexer 42 is supplied to the wiring 14 through the switch 38.

<Semiconductor Film>

A highly purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly purified oxide semiconductor film has extremely low off-state current and high reliability.

Specifically, various experiments can prove low off-state current of a transistor including a channel formation region in a highly purified oxide semiconductor film. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 V to 10 V. In that case, it can be seen that off-state current of the transistor normalized on the channel width is lower than or equal to 100 zA/μm. In addition, a capacitor and a transistor were connected to each other and off-state current was measured using a circuit in which electric charge flowing to or from the capacitor is controlled by the transistor. In the measurement, a highly purified oxide semiconductor film was used for the channel formation region of the transistor, and the off-state current of the transistor was measured from a change in the amount of electric charge of the capacitor per unit hour. As a result, it was found that, in the case where the voltage between the source electrode and the drain electrode of the transistor is 3 V, a lower off-state current of several tens of yoctoamperes per micrometer is obtained. Accordingly, the transistor using the highly purified oxide semiconductor film for the channel formation region has much lower off-state current than a crystalline silicon transistor.

Unless otherwise specified, in the case of an n-channel transistor, the off-state current in this specification is a current that flows between a source and a drain when the potential of a gate is lower than or equal to 0 with the potential of the source as a reference potential while the potential of the drain is higher than those of the source and the gate. Meanwhile, in the case of a p-channel transistor, the off-state current in this specification is a current that flows between a source and a drain when the potential of a gate is higher than or equal to 0 with the potential of the source as a reference potential while the potential of the drain is lower than those of the source and the gate.

In the case where an oxide semiconductor film is used as the semiconductor film, at least indium (In) or zinc (Zn) is preferably included as an oxide semiconductor. The oxide semiconductor preferably contains, in addition to In and Zn, gallium (Ga) serving as a stabilizer that reduces variations in electrical characteristics among transistors using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, the In—Ga—Zn-based oxide allows a transistor with favorable electrical characteristics to be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn—O-based oxide may contain a metal element other than In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline metal oxide target. When ions collide with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flatplate-like sputtered particle reaches a substrate in the state of maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed at a temperature from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on a desired target.

An alkali metal is not an element included in an oxide semiconductor and thus is an impurity. Also, alkaline earth metal is also an impurity in the case where an alkaline earth metal is not included in the oxide semiconductor. In particular, Na among alkali metals becomes $Na^+$ when an insulating film in contact with the oxide semiconductor film is an oxide and Na diffuses into the insulating film. In addition, in the oxide semiconductor film, Na cuts or enters a bond between a metal and oxygen which are contained in an oxide semiconductor. As a result, for example, degradation of electrical characteristics of a transistor, such as a normally-on state of the transistor due to a shift of the threshold voltage in the negative direction or a reduction in mobility, occurs. In addition, variations in electrical characteristics also occur. Specifically, the Na concentration measured by secondary ion mass spectrometry is preferably lower than or equal to $5\times10^{16}/cm^3$, further preferably lower than or equal to $1\times10^{16}/cm^3$, still further preferably lower than or equal to $1\times10^{15}/cm^3$. In a similar manner, the measurement value of a Li concentration is preferably less than or equal to $5\times10^{15}/cm^3$, further preferably less than or equal to $1\times10^{15}/cm^3$. Similarly, the measurement value of a K concentration is preferably less than or equal to $5\times10^{15}/cm^3$, further preferably less than or equal to $1\times10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1\times10^{18}/cm^3$. In that case, the deterioration of the electric characteristics of the transistor can be prevented, so that the reliability of the PLD or the semiconductor device can be improved.

A metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy.

The n-type region serves as a source region or a drain region, resulting in a decrease in the contract resistance between the oxide semiconductor film and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source electrode and the drain electrode are formed by a sputtering method or when heat treatment is performed after the formation of the source electrode and the drain electrode.

The n-type region is more likely to be formed by forming the source electrode and the drain electrode with use of a conductive material which is easily bonded to oxygen. Examples of such a conductive material include Al, Cr, Cu, Ta, Ti, Mo, and W.

The oxide semiconductor film is not limited to a single-layer metal oxide film and may have a layered structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of metal oxide films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

To form the continuous junction, each film needs to be stacked successively without exposure to the atmosphere using a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor, is removed as much as possible. Alternatively, a turbo-molecular pump is preferably used in combination with a cold trap to prevent backflow of gas into the chamber through an evacuation system.

To obtain a highly purified intrinsic oxide semiconductor, a chamber needs to be subjected to high vacuum evacuation, and in addition, a sputtering gas needs to be highly purified. When a highly purified oxygen gas or argon gas having a dew point of $-40°$ C. or lower, preferably $-80°$ C. or lower, and more preferably $-100°$ C. or lower is used as the sputtering gas, moisture or the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen and thus has a function of suppressing generation of oxygen vacancies in the oxide film. That is, oxygen vacancies are less likely to be generated in the first metal oxide film or the third metal oxide film than in the second metal oxide film.

Specifically, when both the second metal oxide film and the first metal oxide film or the third metal oxide film are an In-M-Zn-based oxide, the atomic ratio of the first metal oxide film or the third metal oxide film, In:M:Zn=$x_1$:$y_1$:$z_1$, and the atomic ratio of the second metal oxide film, In:M:Zn=$x_2$:$y_2$:$z_2$, may be determined so that $y_1/x_1$ is larger than $y_2/x_2$. Note that the element M is a metal element which has a higher ability than In to bind to oxygen, examples of which include Al, Ti, Ga, Y, Zr, Sn, La, Ce, Nd, and Hf. The atomic ratio is preferably determined so that $y_1/x_1$ is 1.5 or more times $y_2/x_2$. More preferably, the atomic ratio is determined so that $y_1/x_1$ is 2 or more times $y_2/x_2$. Still more preferably, the atomic ratio is determined so that $y_1/x_1$ is 3 or more times $y_2/x_2$. Further, it is preferable that $y_2$ be greater than or equal to $x_2$ in the second metal oxide film, in which case the transistor can have stable electrical characteristics. Note that $y_2$ is preferably less than 3 times $x_2$ because the field-effect mobility of the transistor is lowered if $y_2$ is 3 or more times $x_2$.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

Note that a channel formation region refers to a region of a semiconductor film of a transistor, which overlaps with a gate electrode and which is between a source electrode and a drain electrode. Further, a channel region refers to a region through which current mainly flows in the channel formation region.

For example, in the case where an In—Ga—Zn-based oxide film formed by a sputtering method is used as each of the first metal oxide film and the third metal oxide film, the first metal oxide film and the third metal oxide film can be deposited with use of an In—Ga—Zn-based oxide target (In:Ga:Zn=1:3:2 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the edge portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and on-state current of the transistor and achieves high-speed operation of a PLD or a semiconductor device using the transistor. Furthermore, in the case where the semiconductor film including the stacked metal oxide films is used in the transistor, the n-type semiconductor region particularly preferably reaches the second metal oxide film part of which is to be a channel region, in which case the mobility and on-state current of the transistor are further increased and higher-speed operation of the PLD or the semiconductor device is achieved.

<Structural Example of PLD>

Figure 9A:
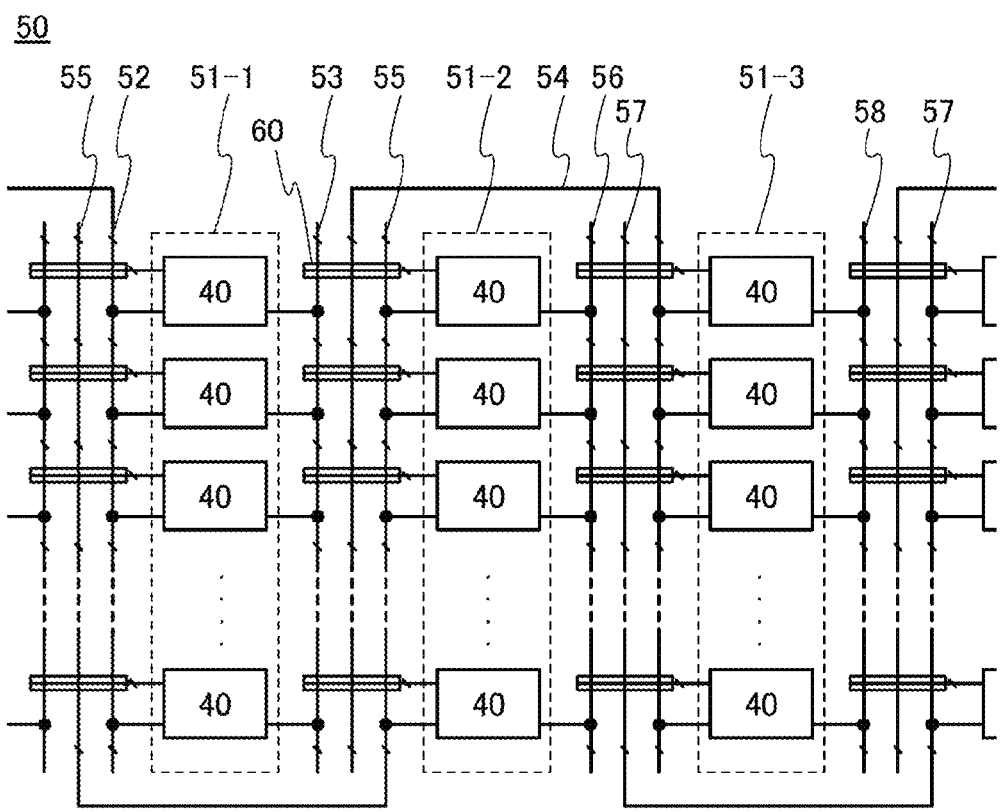
FIGS. 9A to 9C illustrate a structure of a PLD.

Next, a structural example of the PLD of one embodiment of the present invention including the above-described switch circuit 10 will be described. FIG. 9A illustrates a structural example of part of a PLD 50 in one embodiment of the present invention.

In FIG. 9A, a first column 51-1 including a plurality of the PLEs 40, a second column 51-2 including a plurality of the PLEs 40, and a third column 51-3 including a plurality of the PLEs 40 are provided in the PLD 50. FIG. 9A illustrates an example where the first column 51-1, the second column 51-2, and the third column 51-3 are positioned in parallel in this order from the left.

In FIG. 9A, a plurality of wirings 52, a plurality of wirings 53, a plurality of wirings 54, a plurality of wirings 55, a plurality of wirings 56, a plurality of wirings 57, and a plurality of wirings 58 are provided in the PLD 50.

A first output terminal of each PLE 40 in the first column 51-1 is electrically connected to one of the plurality of the wirings 52. A second output terminal of each PLE 40 in the first column 51-1 is electrically connected to one of the plurality of the wirings 53.

A first output terminal of each PLE 40 in the second column 51-2 is electrically connected to one of the plurality of the wirings 55. A second output terminal of each PLE 40 in the second column 51-2 is electrically connected to one of the plurality of the wirings 56.

A first output terminal of each PLE 40 in the third column 51-3 is electrically connected to one of the plurality of the wirings 54. A second output terminal of each PLE 40 in the third column 51-3 is electrically connected to one of the plurality of the wirings 58.

Note that the number of the first output terminals and the number of the second output terminals of each PLE 40 are not limited to one, and either or both of the number of the first output terminals and the number of the second output terminals may be more than one. Note also that one output terminal is always connected to one wiring regardless of the number of the first output terminals and the number of the second output terminals. Thus, when one column includes Y PLEs 40 (Y is a natural number), the PLD 50 at least includes Y wirings connected to the first output terminals and Y wirings connected to the second output terminals.

The first column 51-1 is placed between the plurality of the wirings 52 and the plurality of the wirings 53. The second column 51-2 is placed between the plurality of the wirings 55 and the plurality of the wirings 56. The third column 51-3 is placed between the plurality of the wirings 54 and the plurality of the wirings 58.

The plurality of the wirings 55, which are connected to the first output terminals of the PLEs 40 in the second column 51-2, are provided both between the first column 51-1 and the second column 51-2 and between the first column 51-1 and a column (not illustrated) of the PLEs 40 positioned on the left side of the first column 51-1 in FIG. 9A. The plurality of the wirings 54, which are connected to the first output terminals of the PLEs 40 in the third column 51-3, are provided both between the first column 51-1 and the second column 51-2 and between the second column 51-2 and the third column 51-3. The plurality of the wirings 57 connected to first output terminals of the PLEs 40 (not illustrated) positioned on the right side of the third column 51-3 in FIG. 9A are provided both between the second column 51-2 and the third column 51-3 and between the third column 51-3 and a column (not illustrated) of the PLEs 40 positioned on the right side of the third column 51-3.

When attention is focused on an N-th column (N is a natural number of 3 or more), a plurality of wirings connected to first output terminals of the PLEs 40 in the N-th column are provided both between the N-th column and an (N−1)-th column and between the (N−1)-th column and an (N−2)-th column. In the case where N is 2, a plurality of wirings electrically connected to the first output terminals of the PLEs 40 in the second column are provided both between the second column and the first column and between the first column and an IO. The IO has a function of an interface that controls input of signals to the PLEs 40 from the outside of the PLD or output of signals from the PLEs 40 to the outside of the PLD.

In one embodiment of the present invention, when attention is focused on the (N−1)-th column (N is a natural number of 3 or more), a plurality of wirings electrically connected to first output terminals of the PLEs 40 in the (N−1)-th column, a plurality of wirings electrically connected to the first output terminals of the PLEs 40 in the N-th column, and a plurality of wirings electrically connected to second output terminals of the PLEs 40 in the (N−2)-th column are electrically connected to a plurality of input terminals of the PLEs 40 in the (N−1)-th column through a switch circuit 60 including a plurality of the switch circuits 10.

Specifically, in FIG. 9A, for example, the plurality of the wirings 55 electrically connected to the first output terminals of the PLEs 40 in the second column 51-2, the plurality of the wirings 54 electrically connected to the first output terminals of the PLEs 40 in the third column 51-3, and the plurality of the wirings 53 electrically connected to the second output terminals of the PLEs 40 in the first column 51-1 are electrically connected to a plurality of input terminals of the PLEs 40 in the second column 51-2 through the switch circuits 60.

Figure 9B:
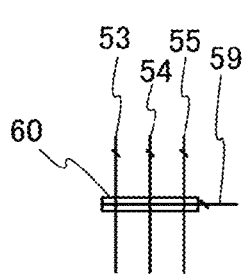

FIG. 9B is a circuit diagram of the switch circuit 60 that controls an electrical connection between the plurality of the wirings 53, the plurality of the wirings 54, and the plurality of the wirings 55 and the plurality of the input terminals of the PLEs 40 in the second column 51-2 illustrated in FIG. 9A. A plurality of wirings 59 in FIG. 9B are electrically connected to the plurality of the input terminals of the PLE 40 in the second column 51-2.

Figure 9C:
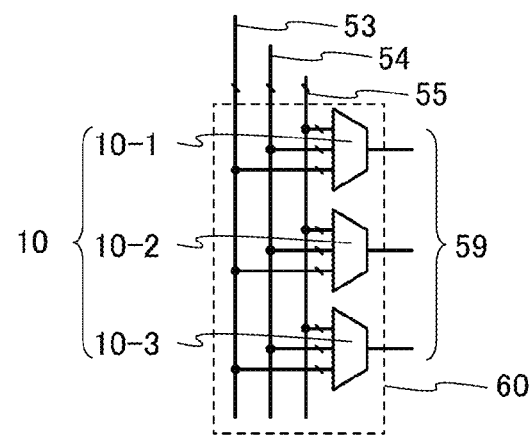

The switch circuit 60 includes a plurality of the switch circuits 10 illustrated in FIG. 1A or FIG. 1B. FIG. 9C illustrates a specific structural example of the switch circuit 60 illustrated in FIG. 9B. As illustrated in FIG. 9C, the switch circuit 60 in FIG. 9B includes three switch circuits 10: a switch circuit 10-1, a switch circuit 10-2, and a switch circuit 10-3.

FIG. 9C illustrates the switch circuit 60 connected to three wirings 59 and thus shows the case where the switch circuit 60 includes the three switch circuits 10: the switch circuit 10-1, the switch circuit 10-2, and the switch circuit 10-3. The number of the switch circuits 10 included in the switch circuit 60 can be determined in accordance with the number of the input terminals of the PLE 40.

FIGS. 9B and 9C illustrate the switch circuit 60, as a typical example, that controls the electrical connection between the pluralities of the wirings 53, 54, and 55 and the plurality of the wirings 59; another switch circuit 60 that controls an electrical connection between plural wirings and plural wirings in FIG. 9A has a structure similar to the above structure.

Figure 10:
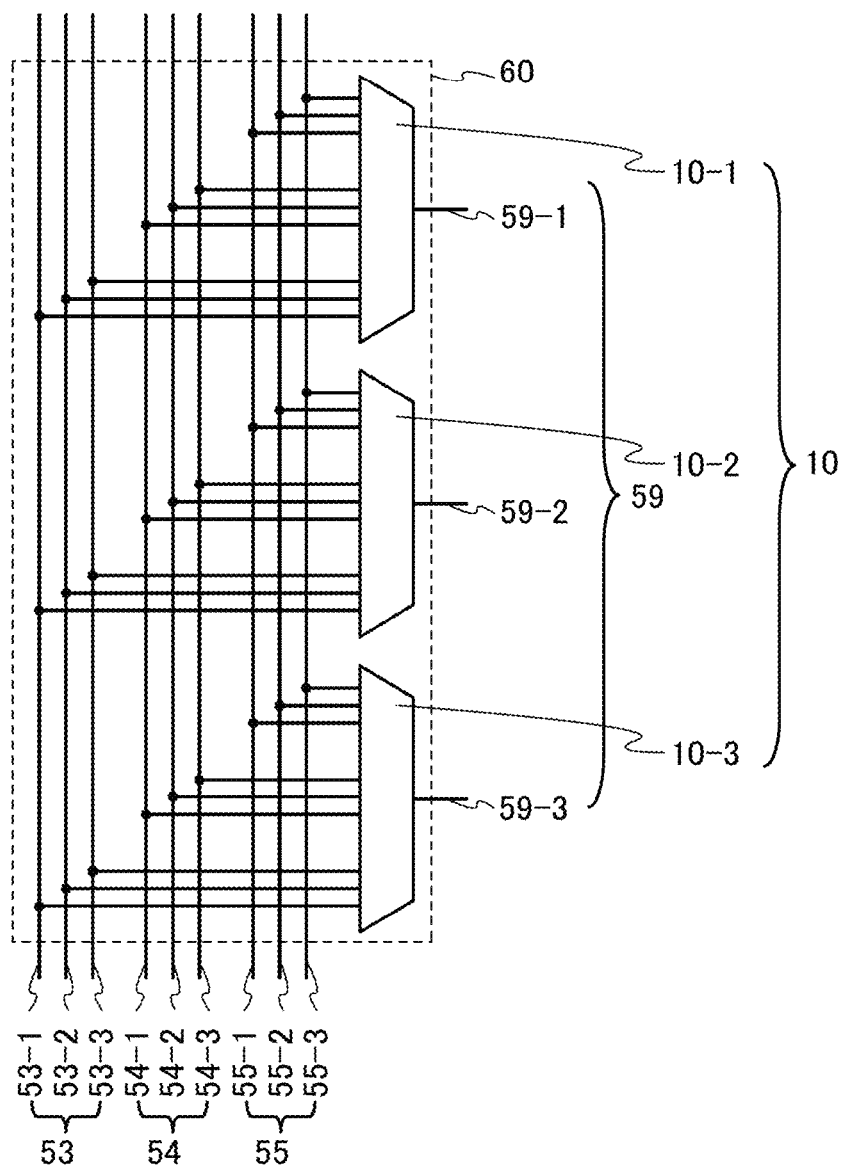
FIG. 10 illustrates a structure of a switch circuit.

FIG. 10 illustrates a more specific structural example of the switch circuit 60 in FIG. 9C. FIG. 10 more specifically shows a connection relation between the plurality of the wirings 53, the plurality of the wirings 54, and the plurality of the wirings 55 and the switch circuit 60. As illustrated in FIG. 10, each of the switch circuits 10 controls an electrical connection between all the pluralities of the wirings 53, 54, and 55 and one of the plurality of the wirings 59.

Specifically, FIG. 10 illustrates an example where the plurality of the wirings 53 include a wiring 53-1, a wiring 53-2, and a wiring 53-3; the plurality of the wirings 54 include a wiring 54-1, a wiring 54-2, and a wiring 54-3; and the plurality of the wirings 55 include a wiring 55-1, a wiring 55-2 and a wiring 55-3. Further, in FIG. 10, the plurality of the wirings 59 include a wiring 59-1, a wiring 59-2, and a wiring 59-3.

In FIG. 10, the switch circuit 10-1 controls an electrical connection between all the pluralities of the wirings 53, 54, and 55 and the wiring 59-1. Specifically, the switch circuit 10-1 has a function of selecting one of the pluralities of the wirings 53, 54, and 55 in accordance with configuration data and electrically connecting the one selected wiring to the wiring 59-1.

In the case where the switch circuit 10 illustrated in FIG. 1A or FIG. 1B is used as the switch circuit 10-1 in FIG. 10, the pluralities of the wirings 53, 54, and 55 in FIG. 10 correspond to the wirings 14-1 to 14-n in FIG. 1A or FIG. 1B and the wiring 59-1 in FIG. 10 corresponds to the wiring 15 in FIG. 1A or FIG. 1B.

In FIG. 10, the switch circuit 10-2 controls an electrical connection between all the pluralities of the wirings 53, 54, and 55 and the wiring 59-2. Specifically, the switch circuit 10-2 has a function of selecting one of the pluralities of the wirings 53, 54, and 55 in accordance with configuration data and electrically connecting the one selected wiring to the wiring 59-2.

In the case where the switch circuit 10 illustrated in FIG. 1A or FIG. 1B is used as the switch circuit 10-2 in FIG. 10, the pluralities of the wirings 53, 54, and 55 in FIG. 10 correspond to the wirings 14-1 to 14-n in FIG. 1A or FIG. 1B and the wiring 59-2 in FIG. 10 corresponds to the wiring 15 in FIG. 1A or FIG. 1B.

The switch circuit 10-3 controls an electrical connection between all the pluralities of the wirings 53, 54, and 55 and the wiring 59-3. Specifically, the switch circuit 10-3 has a function of selecting one of the pluralities of the wirings 53, 54, and 55 in accordance with configuration data and electrically connecting the one selected wiring to the wiring 59-3.

In the case where the switch circuit 10 illustrated in FIG. 1A or FIG. 1B is used as the switch circuit 10-3 in FIG. 10, the pluralities of the wirings 53, 54, and 55 in FIG. 10 correspond to the wirings 14-1 to 14-n in FIG. 1A or FIG. 1B and the wiring 59-3 in FIG. 10 corresponds to the wiring 15 in FIG. 1A or FIG. 1B.

As described above, in one embodiment of the present invention, one of a plurality of wirings, such as the wirings 53, 54, and 55, which are electrically connected to the output terminal of the PLE 40 is selected in accordance with configuration data, and the one selected wiring and one wiring, such as the wiring 59, which is electrically connected to the input terminal of another PLE 40 are electrically connected by the switch circuit 10. Further, in one embodiment of the present invention, the switch circuit 60 including the switch circuit 10 with the above structure and the aforementioned various wirings whose electrical connections are controlled by the switch circuits 60 are provided between columns including the PLEs 40, such as the first column 51-1, the second column 51-2, and the third column 51-3; thus, in the PLD 50 illustrated in FIG. 9A, an electrical connection between one of the PLEs 40 in the second column 51-2 and another one of the PLEs 40 in the second column 51-2 can be controlled by one switch circuit 10. Further, an electrical connection between one of the PLEs 40 in the first column 51-1 and one of the PLEs 40 in the second column 51-2 can be controlled by one switch circuit 10. Moreover, an electrical connection between one of the PLEs 40 in the second column 51-2 and one of the PLEs 40 in the third column 51-3 can be controlled by one switch circuit 10. Thus, with the combination of the layout of the PLEs 40 and the switch circuits 60 illustrated in FIG. 9A and the switch circuit 10 having the structure illustrated in FIG. 1A or FIG. 1B, one embodiment of the present invention can achieve the PLD 50 that includes a small number of switches in a routing resource while having high design flexibility.

<Connection Between IO and Programmable Logic Element>

Figure 11:
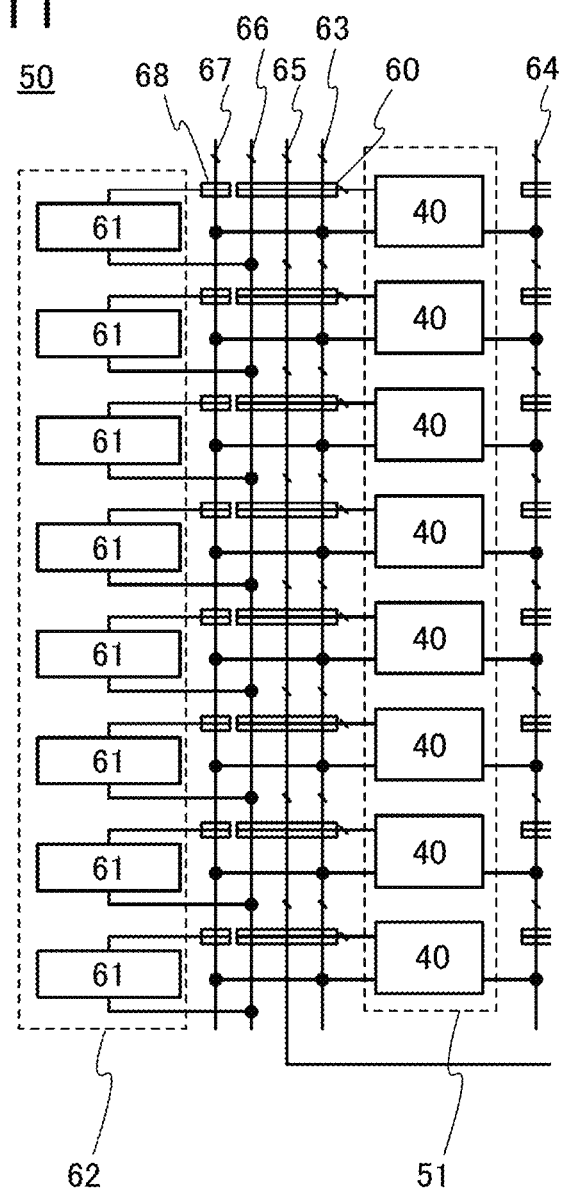
FIG. 11 illustrates a structure of a PLD.

Next, connections between IOs and programmable logic elements in the PLD 50 will be described. FIG. 11 illustrates an example of part of the PLD 50 in one embodiment of the present invention.

In FIG. 11, the column 51 including a plurality of the PLEs 40 and a column 62 including a plurality of IOs 61 are provided in the PLD 50. FIG. 11 illustrates an example where the column 62 and the column 51 are positioned in parallel in this order from the left.

In the PLD 50 illustrated in FIG. 11, a plurality of wirings 63, a plurality of wirings 64, a plurality of wirings 65, a plurality of wirings 66, and a plurality of wirings 67 are provided.

The first output terminals of the PLEs 40 in the column 51 are connected to the plurality of the wirings 63 and the plurality of the wirings 67. The second output terminals of the PLEs 40 in the column 51 are connected to the plurality of the wirings 64. Output terminals of the IOs 61 in the column 62 are connected to the plurality of the wirings 66. The plurality of the wirings 65 are connected to the first output terminals of a plurality of the PLEs 40 (not illustrated) that are positioned on the right side of the column 51 in FIG. 11.

The number of the output terminals of each IO 61 is not limited to one and can be more than one. Note that one output terminal is always connected to one wiring regardless of the number of the output terminals. That is, when the column 62 includes Y IOs 61 (Y is a natural number), the PLD 50 at least includes Y wirings 64 electrically connected to the output terminals.

The plurality of the wirings 63, the plurality of the wirings 65, the plurality of the wirings 66, and the plurality of the wirings 67 are positioned between the column 62 and the column 51. The column 51 is positioned between the plurality of the wirings 63 and the plurality of the wirings 64.

In FIG. 11, the plurality of the wirings 63, the plurality of the wirings 65, and the plurality of the wirings 66 are electrically connected to a plurality of input terminals of the PLEs 40 in the column 51 through the switch circuits 60. Moreover, in FIG. 11, the plurality of the wirings 67 are electrically connected to the input terminals of the IOs 61 in the column 62 through switch circuits 68.

The switch circuit 68 includes one switch circuit 10 having the aforementioned structure. The switch circuit 10 included in the switch circuit 68 has functions of selecting one of the plurality of the wirings 67 in accordance with configuration data and connecting the one selected wiring to the input terminal of each of the IOs 61.

Note that FIG. 9A and FIG. 11 each illustrate the example in which the PLEs 40 that belong to one column are connected to each other through a plurality of wirings provided between columns including the PLEs 40; alternatively, the PLD 50 may include a wiring that directly connects the PLEs 40 belonging to one column.

<Top View of PLD>

Figure 12:
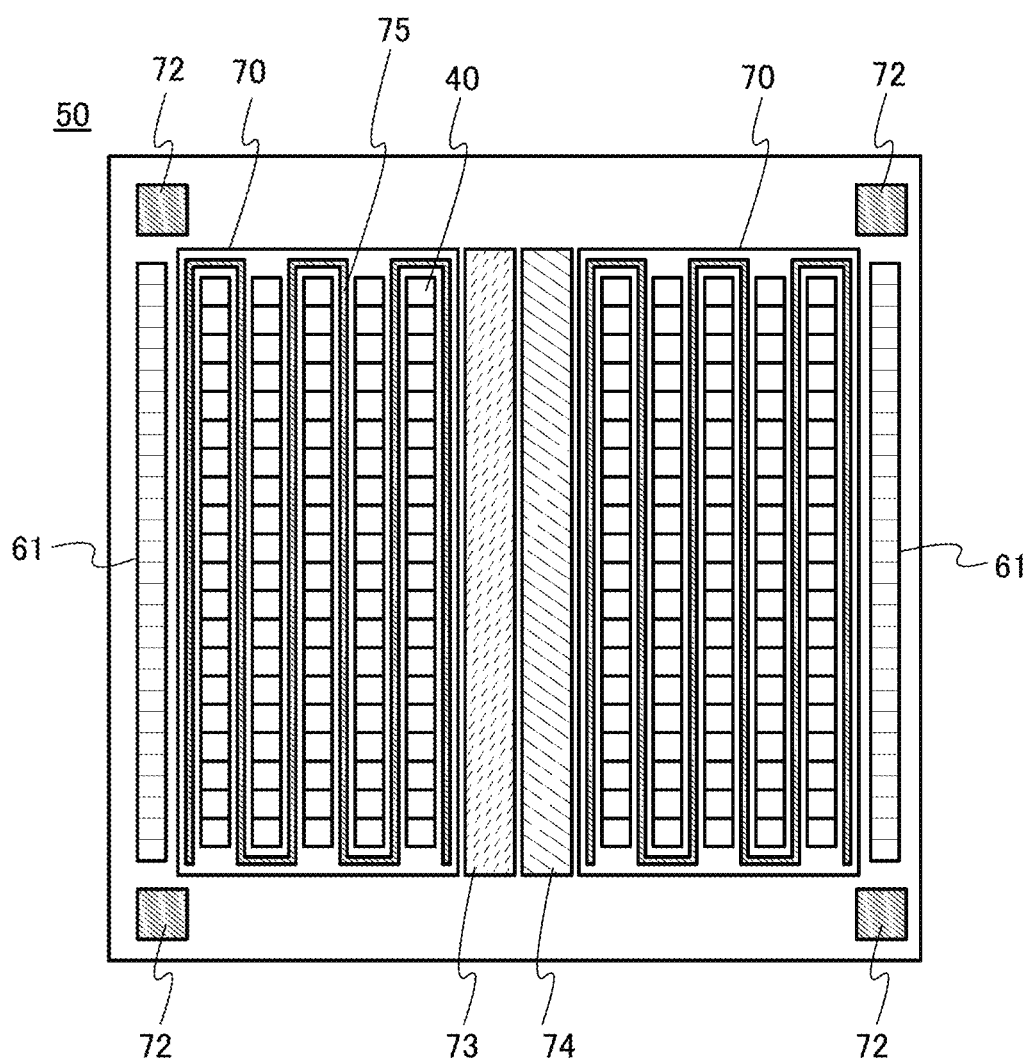
FIG. 12 is a top view of a PLD.

FIG. 12 is an example of a top view of the PLD 50.

The PLD 50 in FIG. 12 includes logic arrays 70, the IOs 61, phase lock loops (PLLs) 72, a RAM 73, and a multiplier 74.

The logic array 70 includes a plurality of the PLEs 40 and a routing resource 75 that includes wirings and switches for controlling connections between the PLEs 40. The PLL 72 has a function of generating the clock signal CK. The RAM 73 has a function of storing data used for logic operation. The multiplier 74 corresponds to a logic circuit dedicated to multiplication. The multiplier 74 is not necessarily provided when the logic array 70 has a function of executing multiplication.

Although FIG. 12 illustrates the case where configuration data for the PLEs 40 with which a logic circuit is determined is stored in a memory element provided outside the PLD 50, the memory element may be provided in the PLD 50.

<Structure Example of LUT>

An example of the structure of the LUT 34 included in the PLE 40 will be described. The LUT 34 can be composed of a plurality of multiplexers. Configuration data can be input to any of input terminals and control terminals of the plurality of multiplexers.

FIG. 13A illustrates one embodiment of the LUT 34 included in the PLE 40.

In FIG. 13A, the LUT 34 is composed of seven two-input multiplexers (multiplexers 81 to 87). Input terminals of the multiplexers 81 to 84 correspond to input terminals M1 to M8 of the LUT 34.

Control terminals of the multiplexers 81 to 84 are electrically connected to each other and correspond to an input terminal IN3 of the LUT 34. Output terminals of the multiplexers 81 and 82 are electrically connected to two respective input terminals of the multiplexer 85. Output terminals of the multiplexers 83 and 84 are electrically connected to two respective input terminals of the multiplexer 86. Control terminals of the multiplexers 85 and 86 are electrically connected to each other and correspond to an input terminal IN2 of the LUT 34. Output terminals of the multiplexers 85 and 86 are electrically connected to two respective input terminals of the multiplexer 87. A control terminal of the multiplexer 87 corresponds to an input terminal IN1 of the LUT 34. An output terminal of the multiplexer 87 corresponds to an output terminal OUT of the LUT 34.

The kind of logic operation performed by the LUT 34 can be determined in such a manner that output signals corresponding to configuration data stored in a configuration memory is input from the configuration memory to the input terminals M1 to M8.

For example, when output signals corresponding to configuration data that are stored in the configuration memory and have logical values "0", "1", "0", "1", "0", "1", "1", and "1" are input from the configuration memory to the input terminals M1 to M8 of the LUT 34 in FIG. 13A, the function of an equivalent circuit illustrated in FIG. 13C is obtained.

FIG. 13B illustrates another embodiment of the LUT 34 included in the PLE 40.

In FIG. 13B, the LUT 34 is composed of three two-input multiplexers (multiplexers 91 to 93) and a two-input OR circuit 94.

Output terminals of the multiplexers 91 and 92 are electrically connected to two respective input terminals of the multiplexer 93. An output terminal of the OR circuit 94 is electrically connected to a control terminal of the multiplexer 93. An output terminal of the multiplexer 93 corresponds to the output terminal OUT of the LUT 34.

The kind of logic operation performed by the LUT 34 can be determined when an output signal corresponding to configuration data stored in a configuration memory is input from the configuration memory to any of a control terminal A1 and input terminals A2 and A3 of the multiplexer 91, a control terminal A6 and input terminals A4 and A5 of the multiplexer 92, and input terminals A7 and A8 of the OR circuit 94.

For example, when output signals corresponding to configuration data that are stored in the configuration memory and have logical values "0", "1", "0", "0", and "0" are input from the configuration memory to the input terminal A2, the input terminal A4, the input terminal A5, the control terminal A6, and the input terminal A8 of the LUT 34 in FIG. 13B, the function of the equivalent circuit illustrated in FIG. 13C is obtained. In the above structure, the control terminal A1, the input terminal A3, and the input terminal A7 correspond to the input terminal IN1, the input terminal IN2, and the input terminal IN3, respectively.

Note that FIGS. 13A and 13B illustrate examples of the LUT 34 composed of two-input multiplexers; alternatively, the LUT 34 may be composed of multiplexers with three or more inputs.

The LUT 34 may also include any or all of a diode, a resistor, a logic circuit, and a switch in addition to the multiplexers. As the logic circuit, a buffer, an inverter, a NAND circuit, a NOR circuit, a three-state buffer, a clocked inverter, or the like can be used. As the switch, an analog switch or a transistor can be used, for example.

The case illustrated in FIG. 13C in which three-input one-output logic operation is performed with the LUT 34 in FIG. 13A or FIG. 13B is described here; however, one embodiment of the present invention is not limited thereto. By appropriately selecting the structure of the LUT 34 and configuration data to be input, logic operation with four or more inputs and two or more outputs can be performed.

<Example of Cross-Sectional Structure of Cell>

Figure 14:
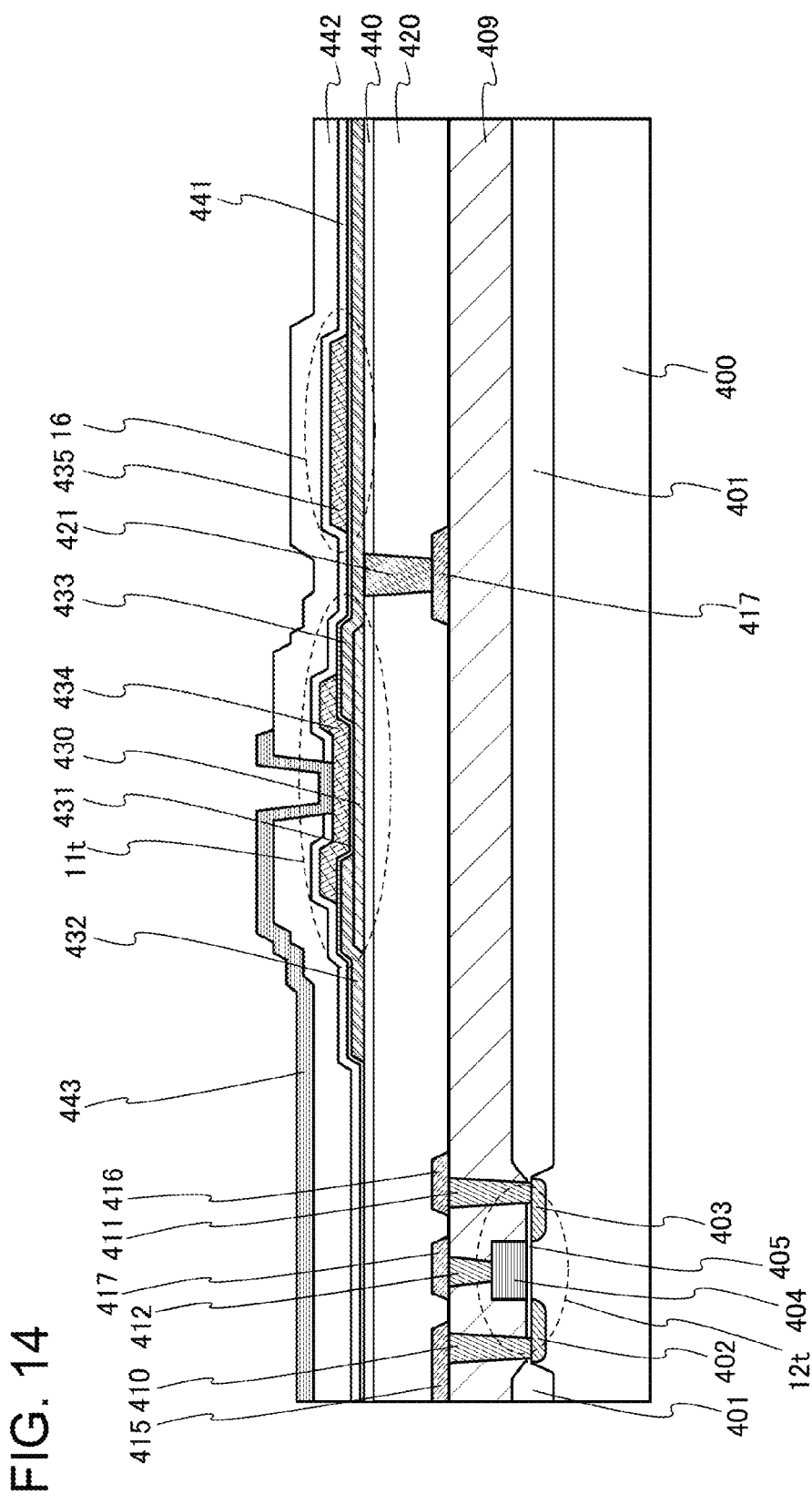
FIG. 14 is a cross-sectional view of a cell.

FIG. 14 illustrates an example of a cross-sectional structure of the transistor 12t, the transistor 11t, and the capacitor 16 included in the switch circuit 10 illustrated in FIG. 2. Note that although not illustrated in FIG. 14, the transistor 13t can be formed in the same formation steps as those of the transistor 12t.

The case is shown where the transistor 11t having a channel formation region in an oxide semiconductor film and the capacitor 16 are formed over the transistor 12t having a channel formation region in a single crystal silicon substrate.

Note that an active layer in the transistors 12t and 13t can be an amorphous, microcrystalline, polycrystalline, or signal crystal semiconductor film of silicon, germanium, or the like. Alternatively, the active layer in the transistors 12t and 13t may be formed using an oxide semiconductor. In the case where an oxide semiconductor is used for active layers of all the transistors, the transistors 11t and 13t are not necessarily stacked over the transistor 12t, and the transistors 11t, 12t, and 13t may be formed in the same layer.

In the case where the transistors 12t and 13t are formed using a silicon thin film, any of the following can be used, for example: amorphous silicon formed by sputtering or vapor deposition such as plasma CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 400 where the transistor 12t is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 14 illustrates the case where an n-type single crystal silicon substrate is used.

The transistor 12t is electrically isolated from other transistors by an element isolation insulating film 401. The element isolation insulating film 401 can be formed by a local oxidation of silicon (LOCOS) method, a trench isolation method, or the like.

Specifically, the transistor 12t includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403, with the gate insulating film 405 placed between the gate electrode 404 and the channel formation region.

An insulating film 409 is provided over the transistor 12t. Openings are formed in the insulating film 409. A wiring 410 in contact with the impurity region 402, a wiring 411 in contact with the impurity region 403, and a wiring 412 electrically connected to the gate electrode 404 are formed in the openings.

The wiring 410 is electrically connected to a wiring 415 formed over the insulating film 409. The wiring 411 is electrically connected to a wiring 416 formed over the insulating film 409. The wiring 412 is electrically connected to a wiring 417 formed over the insulating film 409.

An insulating film 420 and an insulating film 440 are formed to be stacked in this order over the wirings 415 to 417. An opening is formed in the insulating films 420 and 440. A wiring 421 electrically connected to the wiring 417 is formed in the opening.

In FIG. 14, the transistor 11t and the capacitor 16 are formed over the insulating film 440.

The transistor 11t includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433. Note that the conductive film 433 is electrically connected to the wiring 421.

A conductive film 435 is provided over the gate insulating film 431 to overlap with the conductive film 433. A portion where the conductive film 435 overlaps with the conductive film 433 with the gate insulating film 431 placed therebetween functions as the capacitor 16.

Note that the case where the capacitor 16, together with the transistor 11t, is provided over the insulating film 440 is illustrated in FIG. 14 as an example; alternatively, the capacitor 16 may be provided below the insulating film 440 along with the transistor 12t.

An insulating film 441 and an insulating film 442 are formed to be stacked in this order over the transistor 11t and the capacitor 16. An opening is formed in the insulating films 441 and 442. A conductive film 443 that is in contact with the gate electrode 434 in the opening is provided over the insulating film 441.

In FIG. 14, the transistor 11t includes the gate electrode 434 on at least one side of the semiconductor film 430. Alternatively, the transistor 11t may include a pair of gate electrodes with the semiconductor film 430 placed therebetween.

In the case where the transistor 11t has a pair of gate electrodes with the semiconductor film 430 therebetween, one of the gate electrodes may be supplied with a signal for controlling the on/off state of the transistor 11t, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Although FIG. 14 illustrates an example where the transistor 11t has a single-gate structure including one channel formation region corresponding to one gate electrode 434, the transistor 11t may have a multi-gate structure in which a plurality of gate electrodes electrically connected to each other are provided and thus a plurality of channel formation regions are included in one active layer.

<Examples of Electronic Device>

The semiconductor device or the programmable logic device in one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device or the programmable logic device in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15F illustrate specific examples of these electronic devices.

Figure 15A:
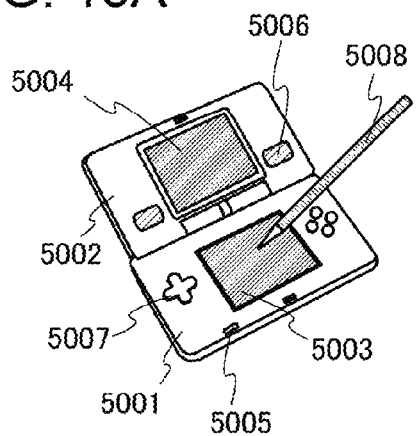
FIGS. 15A to 15F each illustrate an electronic device.

FIG. 15A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 15A has the two display portions 5003 and 5004, the number of display portions included in the portable game console is not limited to two.

Figure 15B:
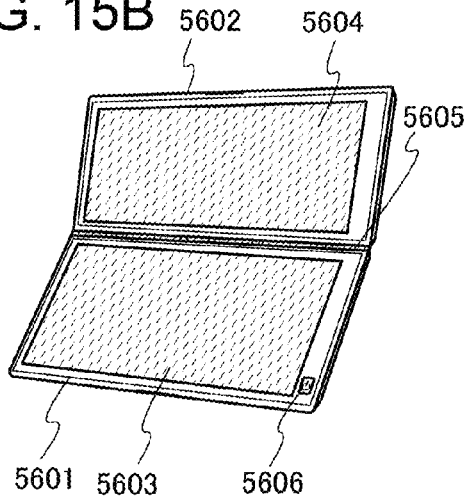

FIG. 15B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 15C:
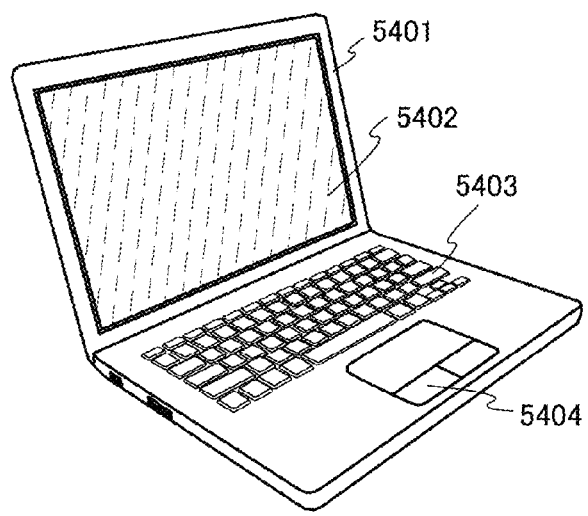

FIG. 15C illustrates a notebook including a housing 5401, a display portion 5402, a keyboard 5403, a pointing device 5404, and the like.

Figure 15D:
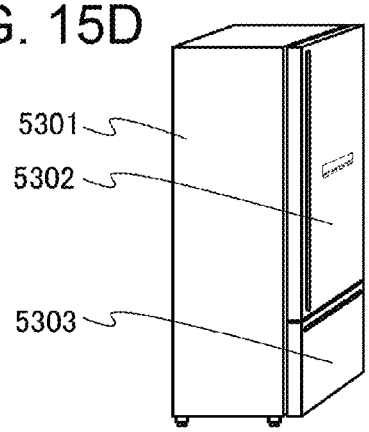

FIG. 15D illustrates an electric refrigerator-freezer including a housing 5301, a refrigerator door 5302, a freezer door 5303, and the like.

Figure 15E:
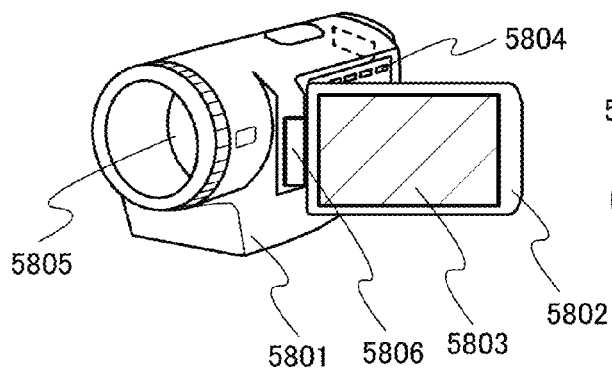

FIG. 15E illustrates a video camera including a first housing 5801, a second housing 5802, a display portion 5803, operation keys 5804, a lens 5805, a joint 5806, and the like.

The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
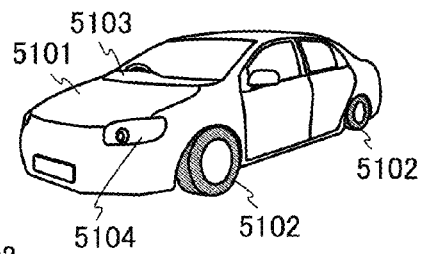

FIG. 15F illustrates a passenger car including a car body 5101, wheels 5102, a dashboard 5103, lights 5104, and the like.

<Structure of Chip>

Figure 16A:
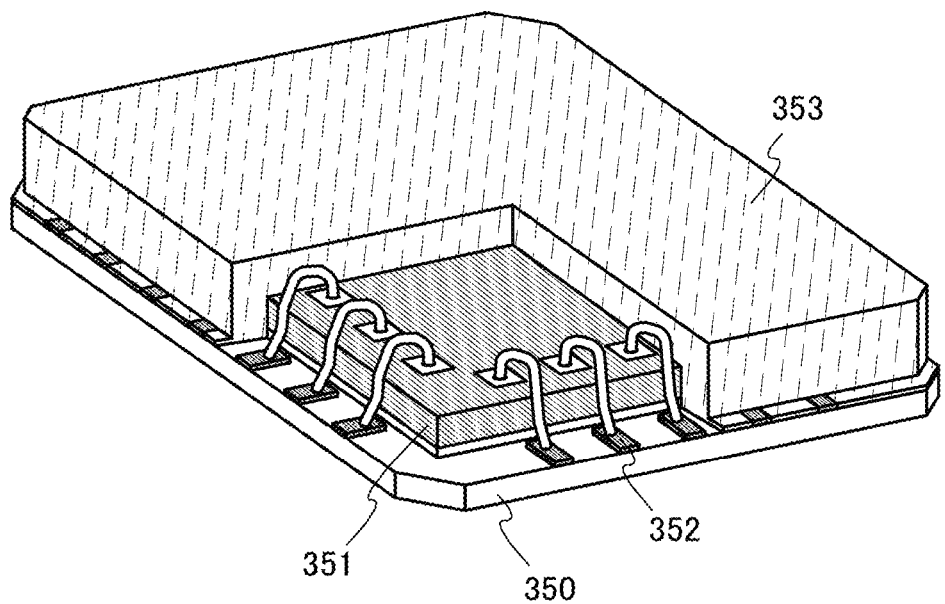
FIGS. 16A and 16B illustrate a chip and a module.

FIG. 16A is a perspective view illustrating a cross-sectional structure of a package using a lead frame interposer.

In the package illustrated in FIG. 16A, a chip 351 corresponding to the semiconductor device of one embodiment of the present invention is connected to a terminal 352 over an interposer 350 by a wire bonding method. The terminal 352 is placed on a surface of the interposer 350 on which the chip 351 is mounted. The chip 351 can be sealed by a mold resin 353 in which case the chip 351 is sealed so that part of each of the terminals 352 is exposed.

Figure 16B:
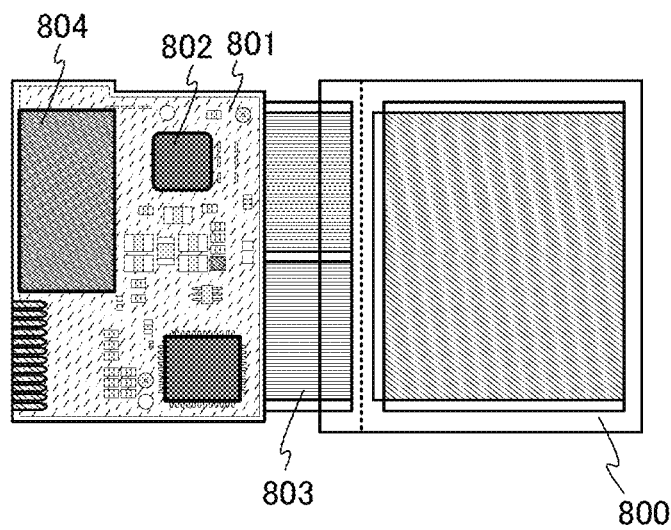

FIG. 16B illustrates the structure of a module of an electronic device in which the package is mounted on a circuit board.

In the module of a mobile phone illustrated in FIG. 16B, a package 802 and a battery 804 are mounted on a printed wiring board 801. In addition, the printed wiring board 801 is mounted on a panel 800 including a display element, by an FPC 803.

<System>

FIG. 17 illustrates a structural example of a system including the semiconductor device of one embodiment of the present invention. A system 900 illustrated in FIG. 17 includes one or more components 901 and a command unit 902 which controls power supply to the components 901 individually. The semiconductor device of one embodiment of the present invention can be used in the command unit 902.

The component 901 includes a power supply line 903, a load 904 which consumes power, and a switch 905 which switches electrical connection between the power supply line 903 and the load 904. When the switch 905 is on (in a conducting state), power is supplied from the power supply line 903 to the load 904 through the switch 905. When the switch 905 is off (in a non-conducting state), power supply from the power supply line 903 to the load 904 is stopped.

The command unit 902 has a function of separately controlling the on/off state of the switch 905 included in each of the components 901. The on/off selection of the switch 905 in each of the components 901 can be conducted at a command input to the command unit 902 from the outside of the system 900.

Note that in the case where the load included in one component and the load included in another component operate by interacting with each other, such a configuration as to conduct on/off control of the switches 905 all at once by the command unit 902 may be employed. Thus, the system of this embodiment can be driven in such a manner that in appearance, power is supplied to components necessary for achieving a certain purpose only for a period necessary for the operation, and the components operate in conjunction with each other in succession over time.

Alternatively, the system 900 may include an ammeter for monitoring the power consumption in the load 904 or the like so that the command unit 902 can judge the necessity of power supply to the load 904 based on the amount of power in the load 904. For example, in the case where the power consumption in the load 904 is approximately the same as the leak power consumed by the load 904 in the standby mode over a certain period, the command unit 902 can judge that the power supply to the load 904 is unnecessary.

Alternatively, the system 900 may include a sensor circuit so that the usage environment and/or the ambient environment of the load 904 can be monitored using physical values of light, sound, temperature, magnetism, pressure, or the like sensed by the sensor circuit, and the command unit 902 can judge the necessity of power supply to the load 904 based on a change sensed by the monitoring. In this case, the command unit 902 selects on or off of the switch 905 based on results of the judgment on the necessity of power supply.

For example, the system 900 of one embodiment of the present invention is attached to a house. Here, household electrical appliances provided in the house such as a lighting device, an electric heater, and an air cleaner correspond to the components. In this case, using a sensor circuit having an optical sensor, the brightness of the room where the lighting device is used is monitored. When the room becomes brighter than a prescribed value by a change in the amount of light streaming through the window, the command unit 902 can turn off the switch 905 of the lighting device to stop power supply to the lighting device.

Further, using a sensor circuit having a temperature sensor, specifically, the temperature of the room where the electric heater is used is monitored. When the temperature of the room becomes higher than a prescribed value by a change in the outside air temperature, the command unit 902 can turn off the switch 905 of the electric heater to stop power supply to the electric heater.

Further, using a sensor circuit 906 having an optical sensor, the usage status of the room where the air cleaner is used is monitored. When human motion is not detected for a certain period by the sensor circuit 906, the command unit 902 can turn off the switch 905 of the air cleaner to stop power supply to the air cleaner.

Note that in the case where the above-described household electrical appliances correspond to the components, the switches 905 are incorporated in the respective household electrical appliances. In the case where the switches 905 are provided outside the household electrical appliances, the household electrical appliances correspond to the loads 904, and the components each include the switch 905 and the household electrical appliance corresponding to the load 904.

In the case where the components are provided independently, on/off selection of the switches 905 by the command unit 902 is conducted using wireless signals. In this case, the switch 905, as a nonvolatile switch, preferably configured to hold a signal for changing the switch state from the command unit 902.

The sensor circuit 906 includes the sensor and a circuit group for processing sensor signals output from the sensor. A temperature sensor, a magnetic sensor, an optical sensor, a microphone, a strain gauge, a pressure sensor, a gas sensor, or the like can be used as the sensor. The temperature sensor may be a contact sensor such as a resistance temperature sensor, a thermistor, a thermocouple, or an IC temperature sensor, or a non-contact sensor such as a thermal type infrared ray sensor or a quantum type infrared ray sensor.

In the case where the components are provided independently, sensor circuits may be provided in the respective components and data obtained by the sensor circuits may be transmitted to the command unit 902 using wireless signals. As illustrated in FIG. 17, the sensor circuits 906 are provided for the respective components and separately transmit data concerning physical values to the command unit 902. The command unit 902 monitors the physical values sensed by the sensor circuits 906 provided in the respective components and judges the necessity of power supply to the loads 904.

The sensor circuit 906 transmits data concerning physical values to the command unit 902. The command unit 902 monitors the physical values sensed by the sensor circuit 906 and judges the necessity of power supply to the loads 904. For example, in the case where the temperature in one component is determined to be higher than or equal to a predetermined value by the sensor circuit 906, power supply to the load 904 such as a speaker, which produces sound, included in another component can be started. With this structure, the system 900 can serve as an alarm system.

Note that the components may be electrical appliances such as a computer, a detector, and a television; devices included in a computer system (a CPU, a memory, a HDD, a printer, a monitor); or electricity-controlled devices incorporated in a car. Alternatively, the components may be internal parts of an LSI such as a CPU or a semiconductor memory. Here, the computer refers to not only a tablet computer, a notebook computer, and a desktop computer, but also a large computer such as a server system.

The concept of the components can be applied to a wide ranging concept of social infrastructure, houses, and the like which require systems, as well as electrical appliances that operate with supplied power.

Here, specific examples of the object to which the system which is one embodiment of the present invention is applied in the case of application to a wide ranging concept of social infrastructure and the like are described. For example, in the case of applying the system which is one embodiment of the present invention to social infrastructure, a railroad, a harbor, a road, and the like can be given as the components illustrated in FIG. 17, and a substation, a power plant, and the like can be given as the command unit. As another example, sections such as rooms or stories of a building can be given as the components illustrated in FIG. 17, and a power management facility, a switchboard, and the like can be given as the command unit.

<Others>

The present invention relates to an object, a method, or a manufacturing method. The present invention also relates to a process, a machine, a manufacture, or a composition of matter. In particular, the present invention relates to, for example, a semiconductor device, a display device, a light-emitting device, a power storage device, a driving method thereof, or a manufacturing method thereof.

Note that the descriptions of these objects in this specification do not disturb the existence of other objects. Note that in one embodiment of the present invention, there is no need to achieve all of the objects. Note that other objects will be apparent from the description of the specification, the drawings, the claims, and the like and other objects can be derived from the description of the specification, the drawings, the claims, and the like.

For example, one object of one embodiment of the present invention is to provide a semiconductor device or the like in which a large amount of current can be prevented from flowing between wirings. Another object of one embodiment of the present invention is to provide a semiconductor device or the like which is less likely to be damaged. Another object of one embodiment of the present invention is to provide a semiconductor device or the like in which the amount of shoot-through current flowing therethrough can be reduced. Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like using a transparent semiconductor layer. Another object of one embodiment of the present invention is to provide a semiconductor device or the like using a semiconductor layer with high reliability. Another object of one embodiment of the present invention is to provide a favorable semiconductor device or the like.

This application is based on Japanese Patent Application serial no. 2012-280383 filed with Japan Patent Office on Dec. 24, 2012, the entire contents of which are hereby incorporated by reference.

What is claimed is:

1. A programmable logic device comprising:
a driver circuit;
a plurality of first programmable logic elements;
a plurality of first wirings;
a second wiring being electrically connected to an input terminal of a second programmable logic element; and
a plurality of circuits each comprising a first switch, a second switch, and a third switch,
wherein the driver circuit is configured to supply configuration data to the second switch of one of the plurality of circuits through one of the plurality of first wirings and the first switch of the one of the plurality of circuits, and
wherein an output terminal of one of the plurality of first programmable logic elements is electrically connected to the second wiring through one of the plurality of first wirings and the second and third switches of one of the plurality of circuits in accordance with the configuration data.

2. The programmable logic device according to claim 1, further comprising a latch being electrically connected to the second wiring.

3. A semiconductor device comprising the programmable logic device according to claim 1.

4. The programmable logic device according to claim 1,
wherein each of the plurality of circuits further comprises a capacitor, and
wherein one terminal of the capacitor is electrically connected to the first switch.

5. The programmable logic device according to claim 1,
wherein the first switch comprises a first transistor,
wherein the second switch comprises a second transistor, and
wherein the third switch comprises a third transistor.

6. The programmable logic device according to claim 5,
wherein a channel formation region of the first transistor comprises an oxide semiconductor film, and
wherein a channel formation region of each of the second transistor and the third transistor comprises silicon.

7. A programmable logic device comprising:
a driver circuit;
a plurality of first programmable logic elements;
a plurality of first wirings;
a second wiring being electrically connected to an input terminal of a second programmable logic element; and
a plurality of circuits each comprising:
a first switch, one terminal of the first switch being electrically connected to one of the plurality of first wirings;

a second switch, one terminal of the second switch being electrically connected to the one of the plurality of first wirings; and a third switch, one terminal of the third switch being electrically connected to the other terminal of the second switch, and the other terminal of the third switch being electrically connected to the second wiring, wherein the driver circuit is configured to supply configuration data to the second switch of one of the plurality of circuits through one of the plurality of first wirings and the first switch of the one of the plurality of circuits, and wherein an output terminal of one of the plurality of first programmable logic elements is electrically connected to the second wiring through one of the plurality of first wirings and the second and third switches of one of the plurality of circuits in accordance with the configuration data.

8. The programmable logic device according to claim 7, wherein each of the plurality of circuits further comprises a capacitor, and wherein one terminal of the capacitor is electrically connected to the other terminal of the first switch.

9. The programmable logic device according to claim 7, further comprising:
a third wiring configured to supply a first potential to the first switch; and
a fourth wiring configured to supply a second potential to the third switch.

10. The programmable logic device according to claim 7, further comprising a latch being electrically connected to the second wiring.

11. A semiconductor device comprising the programmable logic device according to claim 7.

12. A programmable logic device comprising:
a driver circuit;
a plurality of first programmable logic elements;
a plurality of first wirings;
a second wiring being electrically connected to an input terminal of a second programmable logic element; and
a plurality of circuits each comprising:
 a first switch, one terminal of the first switch being electrically connected to one of the plurality of first wirings;
 a second switch, one terminal of the second switch being electrically connected to the one of the plurality of first wirings; and
 a third switch, one terminal of the third switch being electrically connected to the other terminal of the second switch, and the other terminal of the third switch being electrically connected to the second wiring, wherein the driver circuit is configured to supply configuration data to the second switch of one of the plurality of circuits through one of the plurality of first wirings and the first switch of the one of the plurality of circuits, wherein an output terminal of one of the plurality of first programmable logic elements is electrically connected to the second wiring through one of the plurality of first wirings and the second and third switches of one of the plurality of circuits in accordance with the configuration data, wherein the first switch comprises a first transistor, and wherein a channel formation region of the first transistor comprises an oxide semiconductor film.

13. The programmable logic device according to claim 12, wherein each of the plurality of circuits further comprises a capacitor, and wherein one terminal of the capacitor is electrically connected to the other terminal of the first switch.

14. The programmable logic device according to claim 12, further comprising:
a third wiring configured to supply a first potential to the first switch; and
a fourth wiring configured to supply a second potential to the third switch.

15. The programmable logic device according to claim 12, wherein the oxide semiconductor film comprises indium and zinc.

16. The programmable logic device according to claim 12, wherein the second switch comprises a second transistor, and wherein the third switch comprises a third transistor.

17. The programmable logic device according to claim 16, wherein a channel formation region of each of the second transistor and the third transistor comprises silicon.

18. The programmable logic device according to claim 12, further comprising a latch being electrically connected to the second wiring.

19. A semiconductor device comprising the programmable logic device according to claim 12.

* * * * *